(12) United States Patent
Bessho et al.

(10) Patent No.: US 10,361,241 B2
(45) Date of Patent: Jul. 23, 2019

(54) DISPERSION MATERIAL, PHOTOELECTRIC CONVERSION DEVICE, AND IMAGING UNIT

(71) Applicant: Sony Corporation, Tokyo (JP)

(72) Inventors: Takeru Bessho, Kanagawa (JP); Daisuke Hobara, Kanagawa (JP); Michinori Shiomi, Kanagawa (JP)

(73) Assignee: Sony Corporation, Tokyo (JP)

(*) Notice: Subject to any disclaimer, the term of this patent is extended or adjusted under 35 U.S.C. 154(b) by 137 days.

(21) Appl. No.: 14/568,434

(22) Filed: Dec. 12, 2014

(65) Prior Publication Data

US 2015/0189196 A1 Jul. 2, 2015

(30) Foreign Application Priority Data

Dec. 27, 2013 (JP) .................... 2013-272927

(51) Int. Cl.
*H01B 1/08* (2006.01)
*H01L 27/146* (2006.01)
*H01L 51/42* (2006.01)
*H01L 27/30* (2006.01)
*H01L 51/00* (2006.01)

(52) U.S. Cl.
CPC .. *H01L 27/14667* (2013.01); *H01L 27/14625* (2013.01); *H01L 27/307* (2013.01); *H01L 51/426* (2013.01); *H01B 1/08* (2013.01); *H01L 51/0078* (2013.01); *Y02E 10/549* (2013.01)

(58) Field of Classification Search
CPC ....................................... H01B 1/08
See application file for complete search history.

(56) References Cited

U.S. PATENT DOCUMENTS

| 4,668,349 A * | 5/1987 | Cuellar ............... C25B 1/00 205/555 |
| 2003/0188777 A1* | 10/2003 | Gaudiana ........... H01G 9/2063 136/263 |
| 2005/0058713 A1* | 3/2005 | Russell ............... A61K 33/00 424/489 |
| 2008/0072960 A1* | 3/2008 | Kim ................... B82Y 30/00 136/263 |
| 2012/0305067 A1* | 12/2012 | Shin .................. H01G 9/209 136/256 |

FOREIGN PATENT DOCUMENTS

| JP | 2006-245285 | 9/2006 |
| JP | 2010-177392 | 8/2010 |
| JP | 2011-528865 | 11/2011 |

* cited by examiner

*Primary Examiner* — William D Young
(74) *Attorney, Agent, or Firm* — K&L Gates LLP

(57) ABSTRACT

A dispersion material includes: a plurality of semiconductor nanoparticles; and an adsorption molecule configured to selectively absorb light having a predetermined wavelength and adsorbed to each of the plurality of semiconductor nanoparticles, the adsorption molecule having a plane aligned to be non-parallel to a direction from a center portion of each of the plurality of semiconductor nanoparticles toward an adsorption portion of each of the plurality of semiconductor nanoparticles.

15 Claims, 17 Drawing Sheets

(A) SEMICONDUCTOR NANOPARTICLE  (B) ADSORPTION MOLECULE

DISPERSION MATERIAL, PHOTOELECTRIC CONVERSION DEVICE, AND IMAGING UNIT

CROSS REFERENCES TO RELATED APPLICATIONS

The present application claims priority to Japanese Priority Patent Application JP 2013-272927 filed in the Japan Patent Office on Dec. 27, 2013, the entire content of which is hereby incorporated by reference.

BACKGROUND

The present application relates to a dispersion material that includes semiconductor nanoparticles, to a photoelectric conversion device, and to an imaging unit.

In an imaging unit (a solid-state imaging unit) such as a CCD (Charge Coupled Device) image sensor and a CMOS (Complementary Metal Oxide Semiconductor) image sensor, the number of photons that enter a unit pixel (a photoelectric conversion device) decreases as a pixel size is reduced, which results in decrease in S—N ratio.

Accordingly, there is proposed a method of using semiconductor nanoparticles in the photoelectric conversion device (for example, see Japanese Unexamined Patent Application Publication Nos. 2010-177392 and 2006-245285 and Japanese Unexamined Patent Application Publication (Translation of PCT Application) No. 2011-528865). For example, as the semiconductor nanoparticles, lead-selenium compound (PbSe), lead-sulfur compound (PbS), lead-tellurium compound (PbTe), cadmium-selenium compound (CdSe), cadmium-tellurium compound (CdTe), indium-arsenic compound (InAs), and/or the like are used. A dispersion material that includes the semiconductor nanoparticles is applied onto a substrate to form a nanoparticle layer.

SUMMARY

Compared to organic materials such as a dye and a pigment, a semiconductor nanoparticle has a larger volume and a lower light absorption coefficient with respect to visible light per one particle. Further, compared to the organic materials, there are fewer kinds of semiconductor nanoparticles that are capable of selectively absorbing light having a predetermined wavelength. For these reasons, it is difficult to increase light absorption rate per unit volume in a photoelectric conversion section that uses the semiconductor nanoparticles.

It is desirable to provide a dispersion material, a photoelectric conversion device, and an imaging unit that have a higher light absorption rate.

According to an embodiment of the present application, there is provided a dispersion material including: a plurality of semiconductor nanoparticles; and an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

According to an embodiment of the present application, there is provided a photoelectric conversion device including a photoelectric conversion section including a nanoparticle layer. The nanoparticle layer includes: a plurality of semiconductor nanoparticles; and an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

According to an embodiment of the present application, there is provided an imaging unit including a photoelectric conversion device including a nanoparticle layer. The nanoparticle layer includes: a plurality of semiconductor nanoparticles; and an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

In the dispersion material, the photoelectric conversion device, or the imaging unit according to the embodiment of the present application, a molecule (the adsorption molecule) that selectively absorbs light having a predetermined wavelength is adsorbed to the semiconductor nanoparticle, and light absorption rate per unit volume with respect to the light having the predetermined wavelength is therefore increased compared to a case where only the semiconductor nanoparticles are used.

According to the dispersion material, the photoelectric conversion device, and the imaging unit according to the embodiments of the present application, the adsorption molecule that selectively absorbs light having a predetermined wavelength is provided, which improves light absorption rate per unit volume with respect to the light having the predetermined wavelength. Accordingly, it is possible to improve photoelectric conversion efficiency. It is to be noted that the effects of the present application is not necessarily limited to the effects described above, and may be any of the effects described in the present disclosure.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
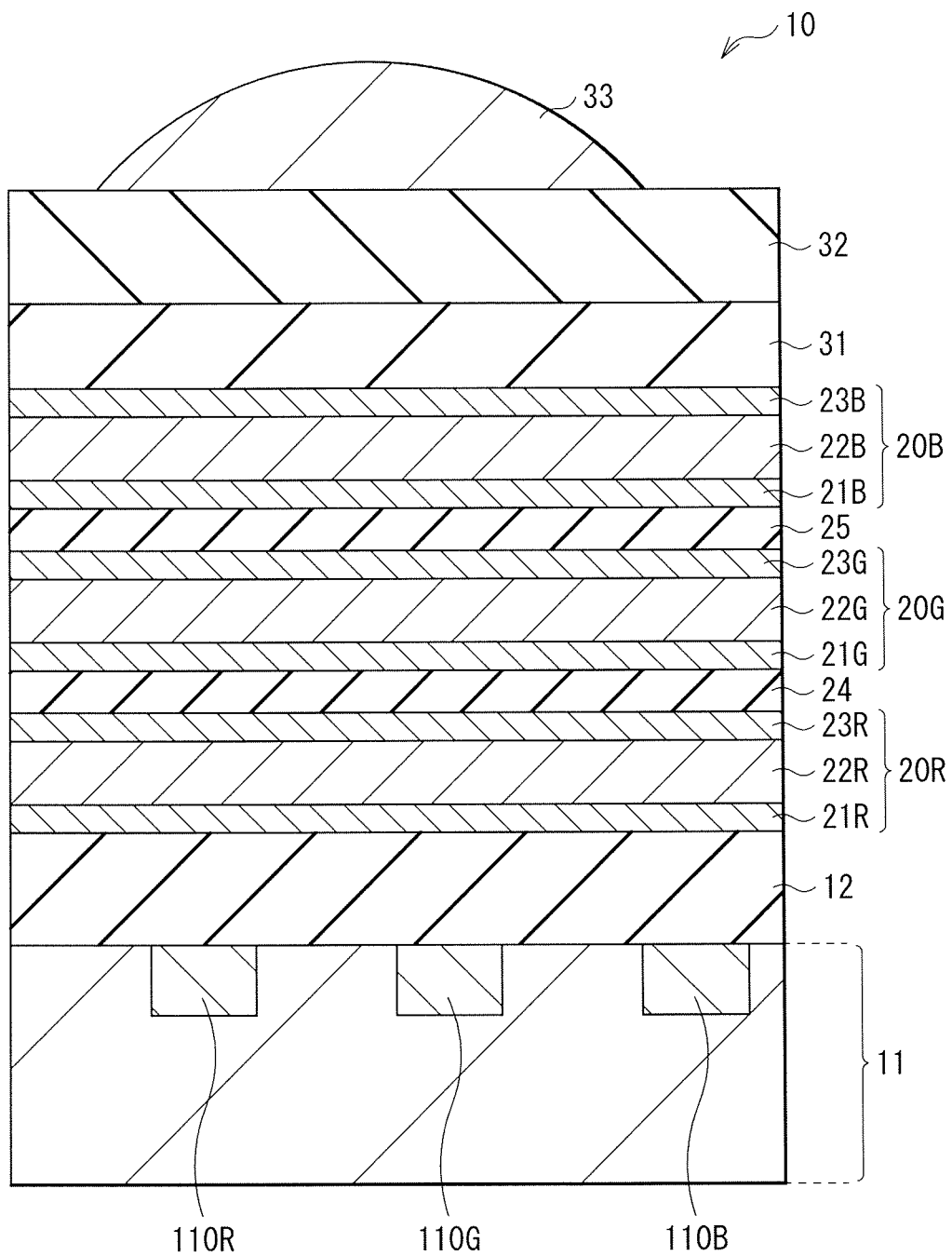
FIG. 1 is a cross-sectional view illustrating an outline configuration of a photoelectric conversion device according to an embodiment of the present application.

Some embodiments of the present application are described below in detail referring to the drawings. The description is provided in the following order.
1. Embodiment (A photoelectric conversion device)
2. Modification 1 (An example provided with an infrared photoelectric conversion section and an ultraviolet photoelectric conversion section)
3. Modification 2 (An example in which a nanoparticle layer includes a plurality of kinds of adsorption molecules)
4. Modification 3 (An example provided with a photoelectric conversion section that includes a silicon layer)
5. Modification 4 (An example provided with a photoelectric conversion section that includes an organic layer)
6. Modification 5 (An example in which light is caused to enter a photoelectric conversion section via a glass substrate)
7. Application Example (An imaging unit)

Embodiment

[Configuration of Photoelectric Conversion Device 10]

FIG. 1 illustrates a cross-sectional configuration of a photoelectric conversion device (a photoelectric conversion device 10) according to an embodiment of the present application. The photoelectric conversion device 10 may configure, for example, a pixel (for example, a pixel P illustrated in FIG. 19 described later) in an imaging unit (for example, an imaging unit 1 illustrated in FIG. 19 described later) such as a CCD image sensor or a CMOS image sensor.

The photoelectric conversion device 10 includes a red photoelectric conversion section 20R, a green photoelectric conversion section 20G, and a blue photoelectric conversion section 20B in order on a silicon substrate 11 with an insulating layer 12 in between. The silicon substrate 11 may be provided on a support substrate (not illustrated) made of a material such as glass. An on-chip lens 33 is provided on the blue photoelectric conversion section 20B with a protective layer 31 and a planarization layer 32 in between. A red electron accumulation layer 110R, a green electron accumulation layer 110G, and a blue electron accumulation layer 110B are provided inside the silicon substrate 11. Light that has entered the on-chip lens 33 is subjected to photoelectric conversion in the red photoelectric conversion section 20R, the green photoelectric conversion section 20G, and the blue photoelectric conversion section 20B, and signal charges are sent from the red photoelectric conversion section 20R to the red electron accumulation layer 110R, from the green photoelectric conversion section 20G to the green electron accumulation layer 110G, and from the blue photoelectric conversion section 20B to the blue electron accumulation layer 110B. The signal charges may be either of electrons or holes generated as a result of the photoelectric conversion. However, description is provided below referring, as an example, to a case where electrons are read as the signal charges.

The silicon substrate 11 may be configured, for example, of a p-type silicon substrate. The red electron accumulation layer 110R, the green electron accumulation layer 110G, and the blue electron accumulation layer 110B provided in the silicon substrate 11 each include an n-type semiconductor region, and the n-type semiconductor regions accumulate electrons (signal charges) supplied from the red photoelectric conversion section 20R, the green photoelectric conversion section 20G, and the blue photoelectric conversion section 20B. The n-type semiconductor regions in the red electron accumulation layer 110R, the green electron accumulation layer 110G, and the blue electron accumulation layer 110B may be formed, for example, by doping the silicon substrate 11 with an n-type impurity such as phosphorus (P) or arsenic (As).

In the silicon substrate 11, a pixel transistor (not illustrated) is provided that is for reading electrons from each of the red electron accumulation layer 110R, the green electron accumulation layer 110G, and the blue electron accumulation layer 110B and, for example, transferring the read electrons to vertical signal lines (vertical signal lines Lsig illustrated in FIG. 19 described later). A floating diffusion (not illustrated) of the pixel transistor is provided inside the silicon substrate 11, and is connected to the red electron accumulation layer 110R, the green electron accumulation layer 110G, and the blue electron accumulation layer 110B. The floating diffusion may be configured of an n-type semiconductor region.

The insulating layer 12 on the silicon substrate 11 may be configured, for example, of silicon oxide ($SiO_2$), silicon nitride (SiN), silicon oxynitride (SiON), hafnium oxide ($HfO_2$), etc. The insulating layer 12 may be configured of a lamination of a plurality of kinds of insulating films. The insulating layer 12 may be configured of an organic insulating material. The insulating layer 12 is provided with plugs (not illustrated) and electrodes (not illustrated) for connecting the red electron accumulation layer 110R to the red photoelectric conversion section 20R, the green electron accumulation layer 110G to the green photoelectric conversion section 20G, and the blue electron accumulation layer 110B to the blue photoelectric conversion section 20B.

The red photoelectric conversion section 20R includes a first electrode 21R, a nanoparticle layer 22R, and a second electrode 23R in order from a position closer to the silicon substrate 11. The green photoelectric conversion section 20G includes a first electrode 21G, a nanoparticle layer 22G, and a second electrode 23G in order from a position closer to the red photoelectric conversion section 20R. The blue photoelectric conversion section 20B includes a first electrode 21B, a nanoparticle layer 22B, and a second electrode 23B in order from a position closer to the green photoelectric conversion section 20G. An insulating layer 24 is provided between the red photoelectric conversion section 20R and the green photoelectric conversion section 20G, and an insulating layer 25 is provided between the green photoelectric conversion section 20G and the blue photoelectric conversion section 20B. Red light (for example, having a wavelength from about 600 nm to about 800 nm) is selectively absorbed in the red photoelectric conversion section 20R, green light (for example, having a wavelength from about 500 nm to about 700 nm) is selectively absorbed in the green photoelectric conversion section 20G, and blue light (for example, having a wavelength from about 400 nm to about 600 nm) is selectively absorbed in the blue photoelectric conversion section 20B, which generates a pair of an electron and a hole.

The first electrode 21R extracts signal charges (carriers) generated in the nanoparticle layer 22R, the first electrode 21G extracts signal charges generated in the nanoparticle layer 22G, and the first electrode 21B extracts signal charges generated in the nanoparticle layer 22B. The first electrodes 21R, 21G, and 21B may be provided, for example, for each pixel. The first electrodes 21R, 21G, and 21B may be configured, for example, of a light transmissive conductive material. Specifically, the first electrodes 21R, 21G, and 21B may be configured, for example, of ITO (Indium Tin Oxide). Alternatively, the first electrodes 21R, 21G, and 21B may be configured, for example, of a tin-oxide-based ($SnO_2$-based) material or a zinc-oxide-based (ZnO-based) material. The tin-oxide-based material may be a material obtained by adding a dopant to tin oxide. The zinc-oxide-based material may be, for example, aluminum-zinc oxide (AZO) obtained by adding aluminum (Al) as a dopant to zinc oxide, gallium-zinc oxide (GZO) obtained by adding gallium (Ga) as a dopant to zinc oxide, indium-zinc oxide (IZO) obtained by adding indium (In) as a dopant to zinc oxide, or the like. Other than the above-mentioned materials, IGZO, CuI, $InSbO_4$, ZnMgO, $CuInO_2$, $MgIn_2O_4$, CdO, $ZnSnO_3$, etc. may be used. The first electrodes 21R, 21G, and 21B each may have a thickness (a thickness in a lamination direction, hereinafter, simply referred to as "thickness"), for example, from about 50 nm to about 500 nm.

Respective electron transfer layers (not illustrated) are provided between the first electrode 21R and the nanoparticle layer 22R, between the first electrode 21G and the nanoparticle layer 22G, and between the first electrode 21B and the nanoparticle layer 22B. The electron transfer layers are for accelerating supply of the electrons generated in the nanoparticle layers 22R, 22G, and 22B to the first electrodes 21R, 21G, and 21B, and may be configured, for example, of titanium oxide ($TiO_2$), zinc oxide (ZnO), or the like. Titanium oxide and zinc oxide may be laminated to configure the electron transfer layer. The electron transfer layer may have a thickness, for example, from about 0.1 nm to about 1000 nm, and may preferably have a thickness from about 0.5 nm to about 200 nm.

Each of the nanoparticle layers 22R, 22G, and 22B absorbs light having a selective wavelength range and performs photoelectric conversion on the absorbed light. Also, each of the nanoparticle layers 22R, 22G, and 22B allows light having other wavelength ranges to pass therethrough. In other words, the nanoparticle layers 22R, 22G, and 22B are each a photoelectric conversion film. The nanoparticle layers 22R, 22G, and 22B each may have a thickness, for example, from about 0.05 μm to about 10 μm. The nanoparticle layers 22R, 22G, and 22B have similar configurations except for having different wavelength ranges of light to be absorbed thereby.

Figure 2:
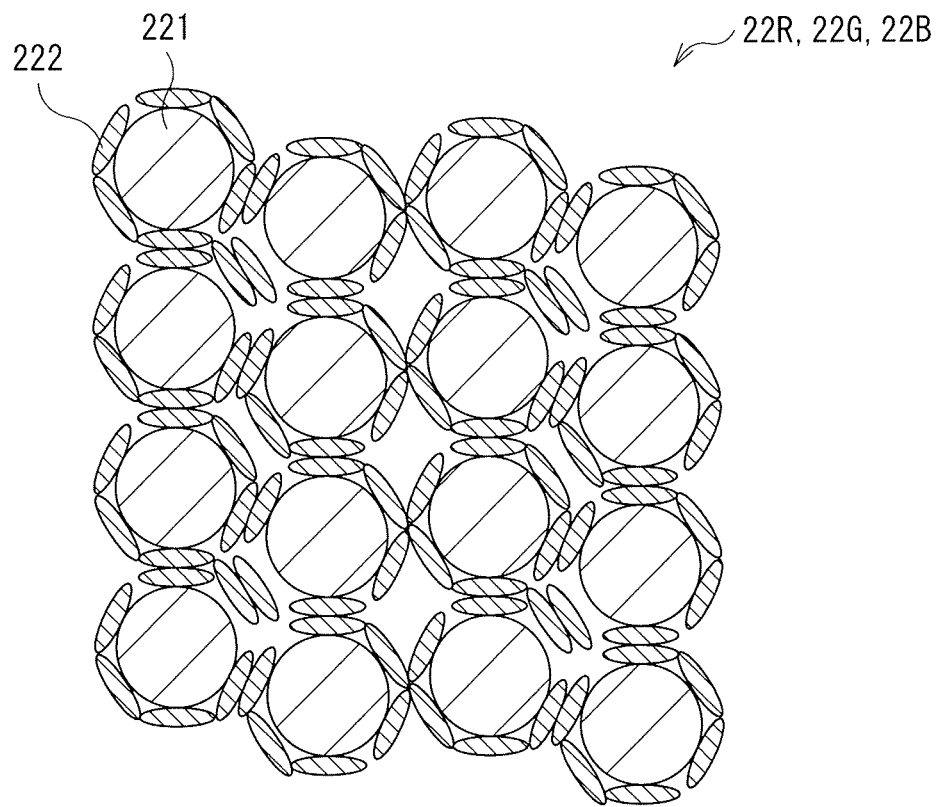
FIG. 2 is a cross-sectional view illustrating a detailed configuration of a nanoparticle layer illustrated in FIG. 1.

FIG. 2 illustrates a cross-sectional configuration of the nanoparticle layers 22R, 22G, and 22B. Each of the nanoparticle layers 22R, 22G, and 22B includes a plurality of semiconductor nanoparticles 221, and adsorption molecules 222 are adsorbed to the respective semiconductor nanoparticles 221. In the present embodiment, these adsorption molecules 222 selectively absorb light having a predetermined wavelength. Accordingly, light absorption rate per unit volume with respect to light having a predetermined wavelength is increased in the nanoparticle layers 22R, 22G, and 22B, which is described later in detail.

The adsorption molecule 222 in the nanoparticle layer 22R selectively absorbs red light. The adsorption molecule 222 in the nanoparticle layer 22G selectively absorbs green light. The adsorption molecule 222 in the nanoparticle layer 22B selectively absorbs blue light. The adsorption molecule 222 in the nanoparticle layer 22R may preferably have a light absorption peak within a wavelength range from about 600 nm to about 700 nm. The adsorption molecule 222 in the nanoparticle layer 22G may preferably have a light absorption peak within a wavelength range from about 500 nm to about 600 nm. The adsorption molecule 222 in the nanoparticle layer 22B may preferably have a light absorption peak within a wavelength range from about 400 nm to about 500 nm. In the nanoparticle layer 22R, a light absorption coefficient of the adsorption molecule 222 with respect to red light may be preferably larger than a light absorption coefficient of the semiconductor nanoparticle 221 with respect to red light. In the nanoparticle layer 22G, a light absorption coefficient of the adsorption molecule 222 with respect to green light may be preferably larger than a light absorption coefficient of the semiconductor nanoparticle 221 with respect to green light. In the nanoparticle layer 22B, a light absorption coefficient of the adsorption molecule 222 with respect to blue light may be preferably larger than a light absorption coefficient of the semiconductor nanoparticle 221 with respect to blue light. Such an adsorption molecule 222 may be, for example, an organic molecule or a metal complex molecule that is used as a pigment or a dye.

The adsorption molecule 222 may have a planar molecule structure. Specifically, the adsorption molecule 222 may be, for example, a phthalocyanine-based compound represented by Formula (1).

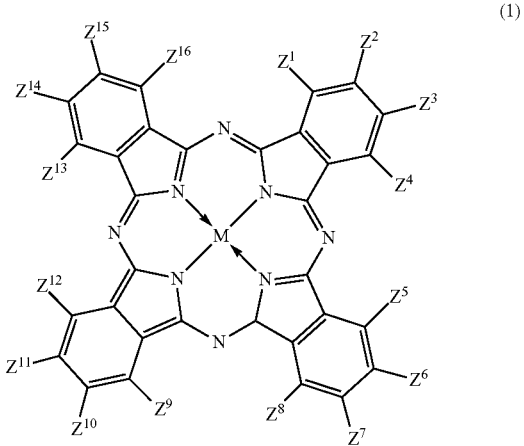

(1)

(Examples of M in Formula (1) may include Al, Zn, Mg, Si, Sn, Rh, Pt, Pd, Mo, Mn, Pb, Cu, Ni, Ti, Co, Fe, a metal chloride, a metal oxide, and a metal hydroxide. Examples of the metal chloride may include $AlCl$, $InCl$, $FeCl$, $TiCl_2$, $SnCl_2$, $SiCl_2$, and $GeCl_2$. Examples of the metal oxide may include TiO and VO. Examples of metal hydroxide may include $Si(OH)_2$. M in Formula (1) may be preferably Mg, Ti, Fe, Co, Ni, Cu, Zn, or Al. When M in Formula (1) is capable of configuring a phthalocyanine skeleton, M in Formula (1) may be any metal or any metal compound. Each of $Z1$ to $Z16$ in Formula (1) represents, independently from one another, a hydrogen atom or a substituent group. Examples of the substituent group may include a halogen atom, an alkyl group, an alkenyl group, an aryl group, a heterocyclic group, a silyl group, a hydroxyl group, a cyano group, a nitro group, an alkoxy group, an aryloxy group, a heterocyclic oxy group, a silyloxy group, an acyloxy group, an alkoxy carbonyloxy group, an aryloxy carbonyloxy group, a carbamoyloxy group, a sulfamoyloxy group, an alkyl sulfonyloxy group, an aryl sulfonyloxy group, an acyl group, an alkoxy carbonyl group, an aryl oxycarbonyl group, a carbamoyl group, an amino group, an anilino group, a heterocyclic amino group, a carbon amide group, a ureido group, an imide group, an alkoxy carbonyl amino group, an aryloxy carbonyl amino group, a sulfone amide group, a sulfamoyl amino group, an azo group, an alkylthio group, an arylthio group, an heterocyclic thio group, an alkyl sulfinyl group, an aryl sulfinyl group, an alkyl sulfonyl group, an aryl sulfonyl group, a sulfamoyl group, a sulfonate group, a phosphonyl group, and a phosphinoyl amino group. Examples of the halogen atom may include fluorine, chlorine, and bromine. The alkyl group may be preferably a linear, branched, or cyclic alkyl group having carbon number from 1 to 48, and may be more preferably that having carbon number from 1 to 18. Examples of the alkyl group may include a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamantyl group. The alkenyl group may be preferably an alkenyl group having carbon number from 2 to 48, and may be more preferably that having carbon number from 2 to 18. Examples of the alkenyl group may include a vinyl group, an allyl group, and a 3-buten-1-yl group. The aryl group may be preferably an aryl group having carbon number from 6 to 48, and may be more preferably that having carbon number from 6 to 24. Examples of the aryl group may include a phenyl group and a naphthyl group. The heterocyclic group may be preferably a heterocyclic group having carbon number from 1 to 32, and may be more preferably that having carbon number from 1 to 18. Examples of the heterocyclic group may include a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazole-1-yl group. The silyl group may be preferably a silyl group having carbon number from 3 to 38, and may be more preferably that having carbon number from 3 to 18. Examples of the silyl group may include a trimethylsilyl group, a triethylsilyl group, a tributylsilyl group, a t-butyldimethylsilyl group, and a t-hexyldimethylsilyl group. The alkoxy group may be preferably an alkoxy group having carbon number from 1 to 48, and may be more preferably that having carbon number from 1 to 24. Examples of the alkoxy group may include a methoxy group, an ethoxy group, a 1-butoxy group, a 2-butoxy group, an isopropoxy group, a t-butoxy group, a dodecyloxy group, and a cycloalkyloxy group. Examples of the cycloalkyloxy group may include a cyclopentyloxy group and a cyclohexyloxy group. The aryloxy group may be preferably an aryloxy group having carbon number from 6 to 48, and may be more preferably that having carbon number from 6 to 24. Examples of the aryloxy group may include a phenoxy group and a 1-naphthoxy group. The heterocyclic oxy group may be preferably a heterocyclic oxy group having carbon number from 1 to 32, and may be more preferably that having carbon number from 1 to 18. Examples of the heterocyclic oxy group may include a 1-phenyltetrazole-5-oxy group and a 2-tetrahydropyranyloxy group. The silyloxy group may be preferably a silyloxy group having carbon number from 1 to 32, and may be more preferably that having carbon number from 1 to 18. Examples of the silyloxy group may include a trimethylsilylocy group, a t-butyldimethylsilyloxy group, and a diphenylmethylsilyloxy group. The acyloxy group may be preferably an acyloxy group having carbon number from 2 to 48, and may be more preferably that having carbon number from 2 to 24. Examples of the acyloxy group may include an acetoxy group, a pivaloyloxy group, a benzoyloxy group, and a dodecanoyloxy group. The alkoxy carbonyloxy group may be preferably an alkoxy carbonyloxy group having carbon number from 2 to 48, and may be more preferably that having carbon number from 2 to 24. Examples of the alkoxy carbonyloxy group may include an ethoxy carbonyloxy group, a t-butoxy carbonyloxy group, and a cycloalkyloxy carbonyloxy group (for example, a cyclohexyloxy carbonyloxy group). The aryloxy carbonyloxy group may be preferably an aryloxy carbonyloxy group having carbon number from 7 to 32, and may be more preferably that having carbon number from 7 to 24. Examples of the aryloxy carbonyloxy group may include a phenoxy carbonyloxy group. The carbamoyloxy group may be preferably a carbamoyloxy group having carbon number from 1 to 48, and may be more preferably that having carbon number from 1 to 24. Examples of the carbamoyloxy group may include an N,N-dimethylcarbamoyloxy group, an N-butylcarbamoyloxy group, an N-phenylcarbamoyloxy group, and an N-ethyl-N-phenylcarbamoyloxy group. The sulfamoyloxy group may be preferably a sulfamoyloxy group having carbon number from 0 to 32, and may be more preferably that having carbon number from 1 to 24. Examples of the sulfamoyloxy group may include an N,N-diethylsulfamoyloxy group and an N-propylsulfamoyloxy group. The alkyl sulfonyloxy group may be an alkyl sulfonyloxy group having carbon number from 1 to 38, and may be more preferably that having carbon number from 1 to 24. Examples of the alkyl sulfonyloxy group may include a methyl sulfonyloxy group, a hexadecyl sulfonyloxy group, and a cyclohexyl sulfonyloxy group. The aryl sulfonyloxy group may be preferably an aryl sulfonyloxy group having carbon number from 6 to 32, and may be more preferably that having carbon number from 6 to 24. Examples of the aryl sulfonyloxy group may include a phenyl sulfonyloxy group. The acyl group may be preferably an acyl group having carbon number from 1 to 48, and may be more preferably that having carbon number from 1 to 24. Examples of the acyl group may include a formyl group, an acetyl group, a pivaloyl group, a benzoyl group, a tetradecanoyl group, and a cyclohexanoyl group. The alkoxy carbonyl group may be preferably an alkoxy carbonyl group having carbon number from 2 to 48, and may be more preferably that having carbon number from 2 to 24. Examples of the alkoxy carbonyl group may include a methoxy carbonyl group, an ethoxy carbonyl group, an octadecyloxy carbonyl group, a cyclohexyloxy carbonyl group, and a 2,6-di-tert-butyl-4-methylcyclohexyloxycarbonyl group. The aryl oxycarbonyl group may be preferably an aryl oxycarbonyl group having carbon number from 7 to 32, and may be more preferably that having carbon number from 7 to 24. Examples of the aryl oxycarbonyl group may include a phenoxy carbonyl group. The carbamoyl group may be preferably a carbamoyl group having carbon number from 1 to 48, and may be more preferably that having carbon number from 1 to 24. Examples of the carbamoyl group may include a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, and an N,N-dicyclohexylcarbamoyl group. The amino group may be preferably an amino group having carbon number not larger than 32, and may be more preferably that having carbon number not larger than 24. Examples of the amino group may include an amino group, a methylamino group, an N,N-dibutylamino group, a tetradecylamino group, a 2-ethylhexylamino group, and a cyclohexylamino group. The anilino group may be preferably an anilino group having carbon number from 6 to 32, and may be more preferably that having carbon number from 6 to 24. Examples of the anilino group may include an anilino group and an N-methylanilino group. The heterocyclic amino group may be preferably a heterocyclic amino group having carbon number from 1 to 32, and may be more preferably that having carbon number from 1 to 18. Examples of the heterocyclic amino group may include a 4-pyridylamino group. The carbon amide group may be preferably a carbon amide group having carbon number from 2 to 48, and may be more preferably that having carbon number from 2 to 24. Examples of the carbon amide group may include an acetamide group, a benzamide group, a tetradecanamide group, a pivaloylamide group, and a cyclohexanamide group. The ureido group may be preferably an ureido group having carbon number from 1 to 32, and may be more preferably that having carbon number from 1 to 24. Examples of the ureido group may include an ureido group, an N,N-dimethylureido group, and an N-phenylureido group. The imide group may be preferably an imide group having carbon number not larger than 36, and may be more preferably that having carbon number not larger than 24. Examples of the imide group may include an N-succinimide group and an N-phthalimide group. The alkoxy carbonyl amino group may be preferably an alkoxy carbonyl amino group having carbon number from 2 to 48, and may be more preferably that having carbon number from 2 to 24. Examples of the alkoxy carbonyl amino group may include a methoxy carbonyl amino group, an ethoxy carbonyl amino group, a t-butoxycarbonylamino group, an octadecyoxy carbonyl amino group, and a cyclohexyloxy carbonyl amino group. The aryloxy carbonyl amino group may be preferably an aryloxy carbonyl amino group having carbon number from 7 to 32, and may be more preferably that having carbon number from 7 to 24. Examples of the aryloxy carbonyl amino group may include a phenoxy carbonyl amino group. The sulfone amide group may be preferably a sulfone amide group having carbon number from 1 to 48, and may be more preferably that having carbon number from 1 to 24. Examples of the sulfone amide group may include a methane sulfone amide group, a butane sulfone amide group, a benzene sulfone amide group, a hexadecane sulfone amide group, and a cyclohexane sulfone amide group. The sulfamoyl amino group may be preferably a sulfamoyl amino group having carbon number from 1 to 48, and may be more preferably that having carbon number from 1 to 24. Examples of the sulfamoyl amino group may include an N,N-dipropylsulfamoylamino group and an N-ethyl-N-dodecylsulfamoylamino group. The azo group may be preferably an azo group having carbon number from 1 to 32, and may be more preferably that having carbon number from 1 to 24. Examples of the azo group may include a phenyl azo group and a 3-pyrazolylazo group. The alkylthio group may be preferably an alkylthio group having carbon number from 1 to 48, and may be more preferably that having carbon number from 1 to 24. Examples of the alkylthio group may include a methylthio group, an ethylthio group, an octylthio group, and a cyclohexylthio group. The arylthio group may be preferably an arylthio group having carbon number from 6 to 48, and may be more preferably that having carbon number from 6 to 24. Examples of the arylthio group may include a phenylthio group. The heterocyclic thio group may be preferably a heterocyclic thio group having carbon number from 1 to 32, and may be more preferably that having carbon number from 1 to 18. Examples of the heterocyclic thio group may include a 2-benzothiazolylthio group, a 2-pyridylthio group, and a 1-phenyltetrazolylthio group. The alkyl sulfinyl group may be preferably an alkyl sulfinyl group having carbon number from 1 to 32, and may be more preferably that having carbon number from 1 to 24. Examples of the alkyl sulfinyl group may include a dodecane sulfinyl group. The aryl sulfinyl group may be preferably an aryl sulfinyl group having carbon number from 6 to 32, and may be more preferably that having carbon number from 6 to 24. Examples of the aryl sulfinyl group may include a phenyl sulfinyl group. The alkyl sulfonyl group may be preferably an alkyl sulfonyl group having carbon number from 1 to 48, and may be more preferably that having carbon number from 1 to 24. Examples of the alkyl sulfonyl group may include a methyl sulfonyl group, an ethyl sulfonyl group, a propyl sulfonyl group, a butyl sulfonyl group, an isopropyl sulfonyl group, a 2-ethylhexylsulfonyl group, a hexadecyl sulfonyl group, an octyl sulfonyl group, and a cyclohexyl sulfonyl group. The aryl sulfonyl group may be preferably an aryl sulfonyl group having carbon number from 6 to 48, and may be more preferably that having carbon number from 6 to 24.

Examples of the aryl sulfonyl group may include a phenyl sulfonyl group and a 1-naphtylsulfonyl group. The sulfamoyl group may be preferably a sulfamoyl group having carbon number not larger than 32, and may be more preferably that having carbon number not larger than 24. Examples of the sulfamoyl group may include a sulfamoyl group, an N,N-dipropylsulfamoyl group, an N-ethyl-N-dodecylsulfamoyl group, an N-ethyl-N-phenylsulfamoyl group, and an N-cyclohexylsulfamoyl group. The phosphonyl group may be preferably a phosphonyl group having carbon number from 1 to 32, and may be more preferably that having carbon number from 1 to 24. Examples of the phosphonyl group may include a phenoxy phosphonyl group, an octyloxy phosphonyl group, and a phenyl phosphonyl group. The phosphinoyl amino group may be preferably a phosphinoyl amino group having carbon number from 1 to 32, and may be more preferably that having carbon number from 1 to 24. Examples of the phosphinoyl amino group may include a diethoxy phosphinoyl amino group and a dioctyloxy phosphinoyl amino group.

Figure 3:
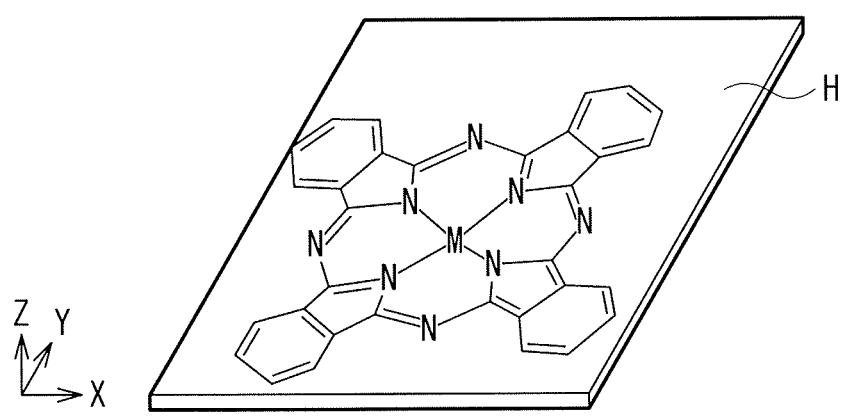
FIG. 3 is a schematic diagram illustrating an example of an adsorption molecule illustrated in FIG. 2.

FIG. 3 schematically illustrates a molecule structure of the phthalocyanine-based compound. In the phthalocyanine-based compound, four phthalic imides are arranged on a plane H (an X-Y plane illustrated in FIG. 3). Herein, the plane H is referred to as a plane of the adsorption molecule 222, and a distance (in a Z-axis direction in FIG. 3) of the adsorption molecule 222 in a direction perpendicular to the plane H is referred to as a thickness of the adsorption molecule 222. The plane H is a plane that has the largest area when the molecule structure of the adsorption molecule 222 is schematically expressed in a cuboid. Any molecule that has a plane in a molecule structure thereof may be used as the adsorption molecule 222.

A molecule such as the phthalocyanine-based compound in which π electron conjugated system expands over the entire molecule is likely to have a planar molecule structure. As the adsorption molecule 222, an organic molecule or a metal complex molecule that is used for a pigment or a dye may be mentioned in addition to the phthalocyanine-based compound. Examples of the pigment may include a pyrene-based compound, a perylene-based compound, a perinone-based compound, a quinacridone-based compound, a quinacridonequinone-based compound, anthraquinone-based compound, a naphthalocyanine-based compound, an anthanthrone-based compound, a benzimidazolone-based compound, a condensed-disazo-based compound, a disazo-based compound, an azo-based compound, an indanthrone-based compound, a triaryl-carbonium-based compound, a dioxazine-based compound, an aminoanthraquinone-based compound, a diketo-pyrrolo-pyrrole-based compound, a ruthenium-complex-based compound, a nickel-complex-based compound, an acene-based compound, indigos, thioindigos, an isoindoline-based compound, an isoindolinone-based compound, a porphyrin-based compound, a pyranthrone-based compound, and an isoviolanthrone-based compound. Examples of the dye may include an azo-based compound, an anthraquinone-based compound, a phthalocyanine-based compound, an azulene-based compound, a squarylium-based compound, a cyanine-based compound, an acene-based compound, a thiophene-based compound, a triphenyl-methane-based compound, a ruthenium-complex-based compound, a nickel-complex-based compound, a xanthene-based compound, a triarylmethane-based compound, a methine dye, and a monomethine dye. Examples of the azo-based compound may include Solvent Yellow 162. For examples of the anthraquinone-based compound, see, for example, Japanese Unexamined Patent Application Publication No. 2001-10881. For examples of the phthalocyanine-based compound, see, for example, US Patent Application Publication No. 2008/0076044A1. Examples of the xanthene-based compound may include C.I. Acid Red 289. Examples of the triarylmethane-based compound may include C.I. Acid Blue 7, C.I. Acid Blue 83, C.I. Acid Blue 90, C.I. Solvent Blue 38, C.I. Acid Violet 17, C.I. Acid Violet 49, and C.I. Acid Green 3. Examples of the monomethine dye may include C.I. Solvent/Yellow 93. A molecule other than those mentioned above may be used as the adsorption molecule 222 as long as the molecule gives no influence on hue of a colored image.

Figure 4:
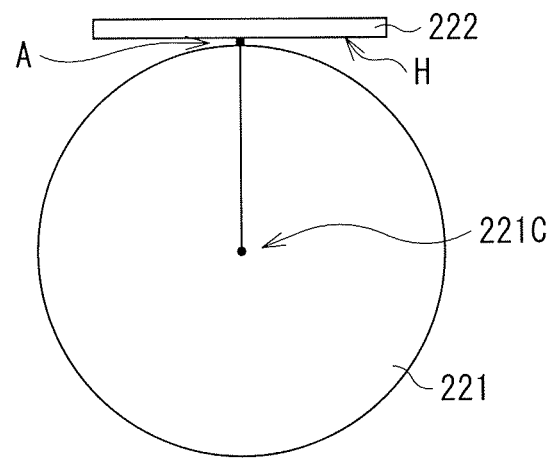
FIG. 4 is a schematic diagram illustrating an alignment direction of the adsorption molecule illustrated in FIG. 2.

FIG. 4 schematically illustrates a state in which the adsorption molecule 222 is adsorbed to the semiconductor nanoparticle 221. The adsorption molecule 222 is adsorbed to the semiconductor nanoparticle 221 at an adsorption portion (an adsorption portion A). A plane (for example, the plane H illustrated in FIG. 3) of the adsorption molecule 222 is aligned to be non-parallel, and may be preferably aligned to be almost perpendicular, to a direction from a center portion (a center portion 221C) of the semiconductor nanoparticle 221 toward the adsorption portion A. In other words, the plane of the adsorption molecule 222 may preferably face the semiconductor nanoparticle 221, and may be preferably aligned in a direction along the tangential line of the semiconductor nanoparticle 221. A thickness direction of the adsorption molecule 222 may be preferably parallel to a diameter direction of the semiconductor nanoparticle 222. As a result, the distance (the inter-particle distance D in FIG. 9 described later) between the adjacent semiconductor nanoparticles 221 is made shorter, and the nanoparticle layer 22R provided with densely-arranged semiconductor nanoparticles 221 is formed thereby, which is described later in detail.

The adsorption molecule 222 has heat tolerance. For example, it may be preferable that light absorption characteristics of the adsorption molecule 222 is not varied due to pyrolysis under temperature from about 100° C. to about 300° C. For example, the phthalocyanine-based compound is a compound having heat tolerance. The adsorption molecule 222 may preferably have light tolerance as well.

Figure 5:
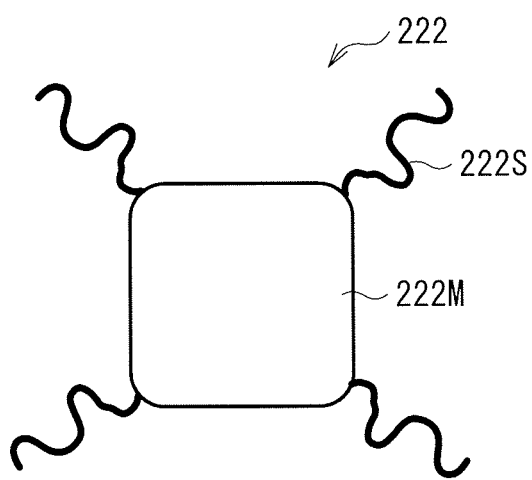
FIG. 5 is a schematic diagram illustrating an example of a structure of the adsorption molecule illustrated in FIG. 2.

FIG. 5 schematically illustrates a structure of the adsorption molecule 222. The adsorption molecule 222 may include, for example, a main portion 222M that forms a planar molecule structure, and a side chain 222S connected to the main portion 222M. For example, the side chain 222S may allow the adsorption molecule 222 to be dispersed in an organic solvent. The nanoparticle layers 22R, 22G, and 22B may be formed, for example, by dispersing the semiconductor nanoparticles 221 and the adsorption molecules 222 into a solvent and performing application of the resultant. Because the side chain 222S has high solubility with respect to the organic solvent, it becomes easier for the adsorption molecule 222 to be dispersed into the solvent. The side chain 222S having high solubility with respect to the organic solvent may be, for example, an alkyl group having carbon number of 4 or larger, etc. The side chain 222S may be, for example, Z1 to Z16 in Formula (1). Any functional group may be used as the side chain 222S as long as the functional group exhibits interaction with the organic solvent and is capable of increasing solubility of the adsorption molecule 222 with respect to the organic solvent. The side chain 222S may include, for example, a hydrocarbon group, an amine group, a phosphono group, a phosphine group, a carboxyl group, a hydroxyl group, a thiol group, or the like. In a case where a water-based solvent is used when the nanoparticle layers 22R, 22G, and 22B are formed, a group that exhibits water solubility may be used as the side chain 222S.

For example, the side chain 222S may include a functional group or an atom that interacts with the surface of the semiconductor nanoparticle 221, and the adsorption molecule 222 may be adsorbed to the semiconductor nanoparticle 221 due to the functional group or the atom. Examples of such a functional group may include an amine group, a phosphono group, a phosphine group, a carboxyl group, a hydroxyl group, and a thiol group. Examples of such an atom may include fluorine, chlorine, bromine, oxygen, sulfur, nitrogen, phosphorous, and silicon. To give an example, the adsorption molecule 222 including sulfur in the side chain 222S is easily adsorbed to the semiconductor nanoparticle 221 configured of PbS. In the adsorption molecule 222 that includes such a functional group or such an atom in the side chains 222S, the side chains 222S may preferably have symmetry. When the adsorption molecule 222 is adsorbed to the semiconductor nanoparticle 221 due to the symmetrically-arranged functional groups, the structure is stabilized, which causes the adsorption molecule 222 to be less likely to be desorbed. The main portion 222M of the adsorption molecule 222 may include an atom or a functional group that is likely to be bonded to the semiconductor nanoparticle 221, and the main portion 222M may be bonded to the surface of the semiconductor nanoparticle 221. For example, M in Formula (1) may be an atom or a compound that is likely to be bonded to the semiconductor nanoparticle 221.

Figure 6:
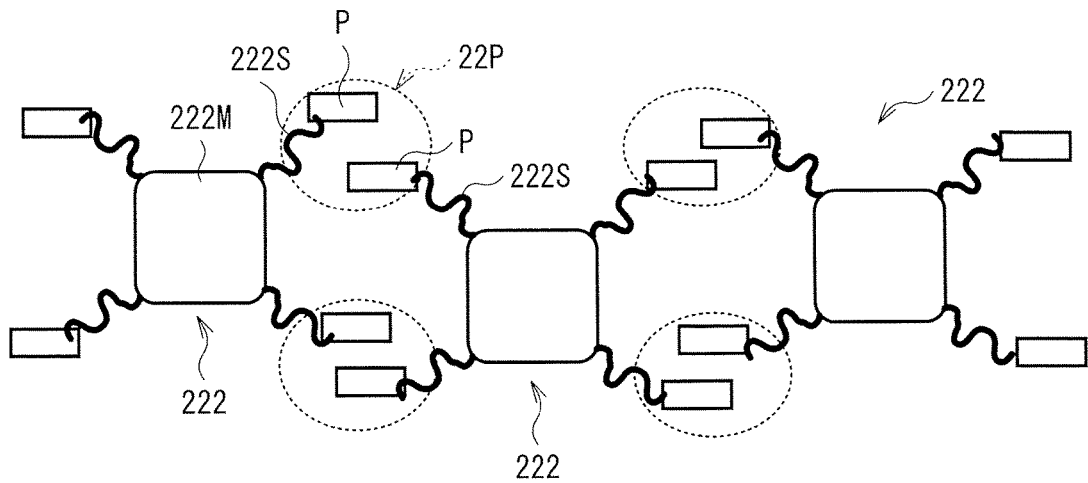
FIG. 6 is a schematic diagram illustrating another example of the structure of the adsorption molecule illustrated in FIG. 2.

The side chain 222S may preferably include a polymerizable functional group (a polymerizable group P in FIG. 6 described later). FIG. 6 schematically illustrates the adsorption molecule 222 that includes the polymerizable group P in the side chain 222S. The polymerizable group P is a functional group that may cause a polymerization reaction, for example, in response to light application, heating, etc. When the adsorption molecule 222 that includes such a polymerizable group P in the side chain 222S is used to cause a polymerization reaction, the side chains 222S of the adjacent adsorption molecules 222 are bonded to each other in a polymerization reaction portion 22P, and a network configured of a plurality of adsorption molecules 222 is formed. Heat tolerance is increased in the adsorption molecules 222 in which a plurality of adsorption molecules 222 are bonded to one another. Examples of the polymerizable group P may include an unsaturated ethylene group (such as a methacrylic group, an acrylic group, and a styryl group) and a cyclic ether group (such as an epoxy group and an oxetanyl group). The unsaturated ethylene group may be preferably used as the polymerizable group P because the unsaturated ethylene group has higher heat tolerance and higher solvent tolerance.

Figure 7:
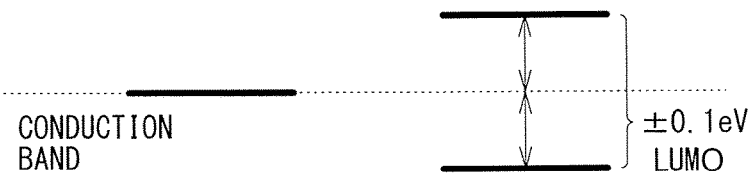
FIG. 7 is a diagram illustrating an example of energy bands of a semiconductor nanoparticle and the adsorption molecule illustrated in FIG. 2.
Figure 7:
Figure 8:
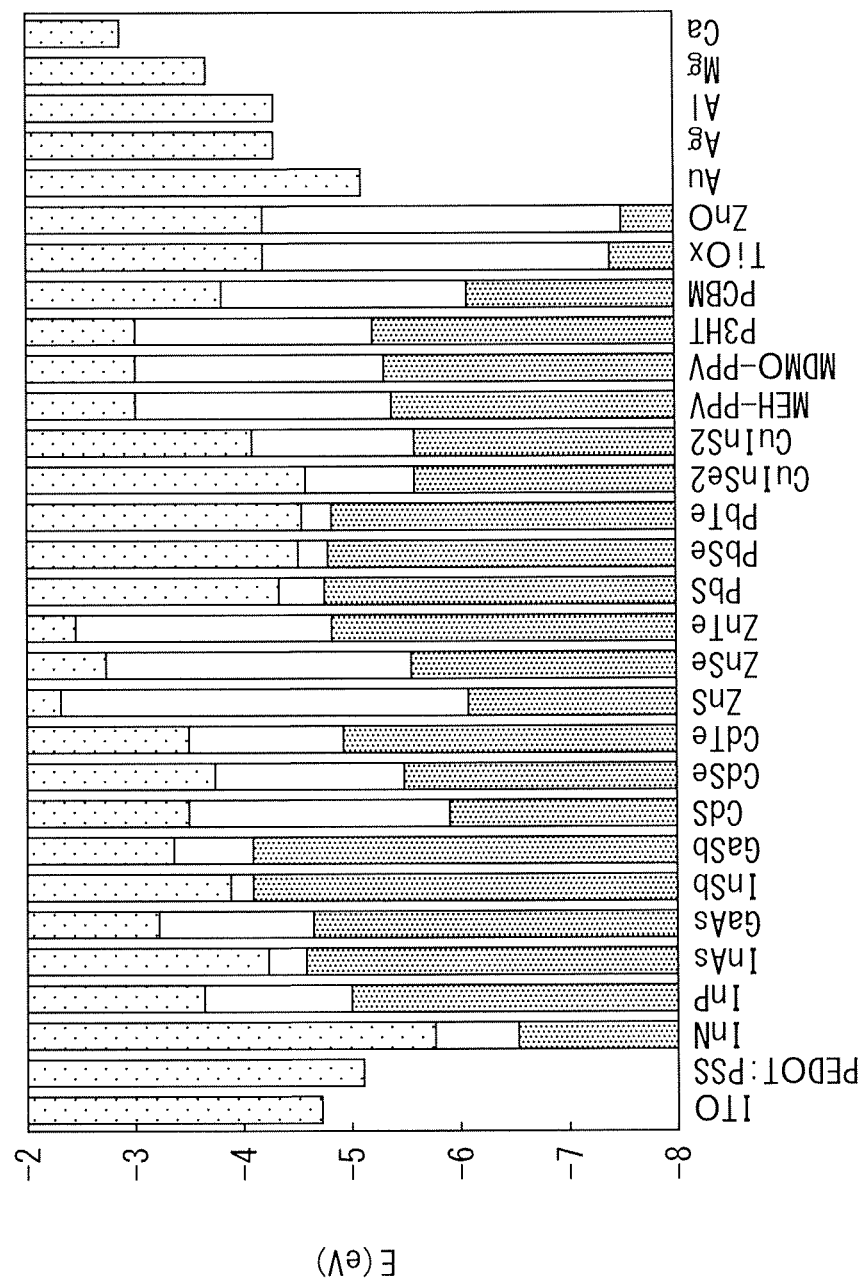
FIG. 8 is a diagram illustrating energy levels of various semiconductor materials.

The LUMO energy level of the adsorption molecule 222 may be preferably near the energy level of the conduction band of the semiconductor material configuring the semiconductor nanoparticle 221, and may be preferably within 0.2 eV (±0.1 eV) therefrom. FIG. 7 illustrates a relationship between the energy levels of the conduction band and the valence band of the semiconductor material configuring the semiconductor nanoparticle 221 and the energy levels of LUMO and HOMO of the adsorption molecule 222. FIG. 8 illustrates energy levels of the conduction bands and the valence bands of various semiconductor materials. Due to the existence of LUMO of the adsorption molecule 222 near the conduction band of the semiconductor nanoparticle 221, an electron excited in response to light absorption by the semiconductor nanoparticle 221 becomes easier to move from the conduction band of the semiconductor nanoparticle 221 to LUMO of the adsorption molecule 222. To give an example, the LUMO energy level of phthalocyanine is −3.2 eV. When ZnSe (having the energy level of the conduction band of −2.8 eV) is used as the semiconductor nanoparticle 221, and phthalocyanine is used as the adsorption molecule 222, electrons easily move from the semiconductor nanoparticle 221 to the adsorption molecule 222.

Also, the HOMO energy level of the adsorption molecule 222 may be preferably near the energy level of the valence band of the semiconductor material configuring the semiconductor nanoparticle 221, and may be preferably within 0.2 eV (±0.1 eV) therefrom (FIG. 7). This makes it easier for a hole generated in response to light absorption by the semiconductor nanoparticle 221 to move from the valence band of the semiconductor nanoparticle 221 to HOMO of the adsorption molecule 222. To give an example, the HOMO energy level of phthalocyanine is −4.9 eV. When ZnTe (having energy level of the valence band of −5.0 eV) is used as the semiconductor nanoparticle 221 and phthalocyanine is used as the adsorption molecule 222, holes easily move from the semiconductor nanoparticle 221 to the adsorption molecule 222.

The semiconductor nanoparticle 221 may be configured, for example, of $TiO_2$, ZnO, $WO_3$, NiO, $MoO_3$, CuO, $Ga_2O_3$, $SrTiO_3$, $SnO_2$, $InSnO_x$, $Nb_2O_3$, $MnO_2$, $V_2O_3$, CrO, $CuInSe_2$, $CuInS_2$, $AgInS_2$, Si, Pbs, PbSe, PbTe, CdS, CdSe, CdTe, $Fe_2O_3$, GaAs, GaP, InP, InAs, Ge, $In_2S_3$, $Bi_2S_3$, ZnSe, ZnTe, ZnS, or the like. The semiconductor nanoparticle 221 in the nanoparticle layer 22R may be configured of a semiconductor material that selectively absorbs red light, the semiconductor nanoparticle 221 in the nanoparticle layer 22G may be configured of a semiconductor material that selectively absorbs green light, and the semiconductor nanoparticle 221 in the nanoparticle layer 22B may be configured of a semiconductor material that selectively absorbs blue light. Specifically, the absorption end of the semiconductor nanoparticle 221 in the nanoparticle layer 22R may be within a wavelength range from about 600 nm to about 800 nm, the absorption end of the semiconductor nanoparticle 221 in the nanoparticle layer 22G may be within a wavelength range from about 500 nm to about 700 nm, and the absorption end of the semiconductor nanoparticle 221 in the nanoparticle layer 22B may be within a wavelength range from about 400 nm to about 600 nm. Examples of the material configuring the semiconductor nanoparticle 221 in the nanoparticle layer 22R may include PbSe, CdTe, PbS, Si, PbTe, CdSe, $CuInSe_2$, $CuInS_2$, $AgInS_2$, $MnO_2$, $V_2O_3$, CrO, GaAs, $Fe_2O_3$, InP, InAs, Ge, $Bi_2S_3$, and CuO. Examples of the material configuring the semiconductor nanoparticle 221 in the nanoparticle layer 22G may include CdS, GaP, and ZnTe. Examples of the material configuring the semiconductor nanoparticle 221 in the nanoparticle layer 22B may include $WO_3$, ZnSe, and $In_2S_3$. An average primary particle size of the semiconductor nanoparticles 221 may be from about 1 nm to about 100 nm both inclusive. The term "primary particle size" herein refers to the minimum particle size of the semiconductor nanoparticles 221. For example, when the particles are aggregated or bonded to one another, the term "primary particle size" refers to the size of each of the particles.

The radius of the semiconductor nanoparticle 221 may be preferably about 1 nm or larger. The radius of the semiconductor nanoparticle 221 is about ½ of the primary particle size of the semiconductor nanoparticle 221, and refers to about ½ of a major diameter of the particle when the semiconductor nanoparticle 221 has a shape other than a sphere. When the radius of the semiconductor nanoparticle 221 is made larger, the surface area of the semiconductor nanoparticle 221 becomes larger, which makes it possible for larger number of adsorption molecules 222 to be adsorbed to the semiconductor nanoparticles 221.

Figure 9:
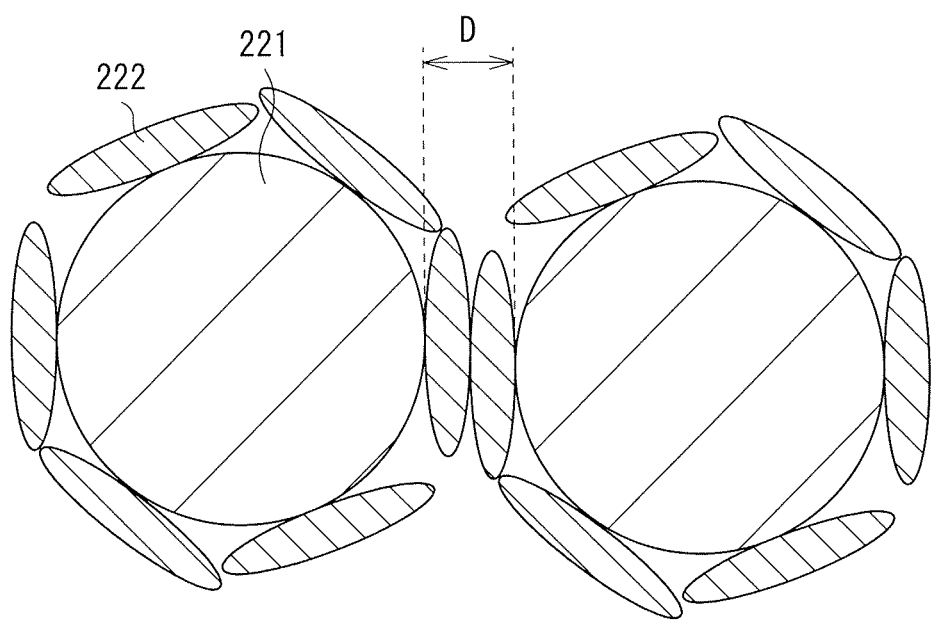
FIG. 9 is a cross-sectional view illustrating an interparticle distance of the semiconductor nanoparticles in a nanoparticle layer illustrated in FIG. 1.

FIG. 9 illustrates the distance (the inter-particle distance D) between adjacent semiconductor nanoparticles 221 in the nanoparticle layers 22R, 22G, and 22B. The inter-particle distance D is a distance from a surface of one of the adjacent semiconductor nanoparticles 221 to a surface of the other of the adjacent semiconductor nanoparticles 221. As described above, in the nanoparticle layers 22R, 22G, and 22B, the plane of the adsorption molecule 222 is aligned to be non-parallel to the direction from the center portion of the semiconductor nanoparticle 221 toward the adsorption portion thereof, and the plurality of semiconductor nanoparticles 221 are densely arranged. The adjacent semiconductor nanoparticles 221 may be arranged, for example, with two adsorption molecules 222 in between. The inter-particle distance D in this case may be, for example, sum of the thicknesses of the two adsorption molecules 222. The inter-particle distance D may be, for example, about 10 nm or smaller. The dense arrangement of the semiconductor nanoparticles 221 makes it easier for distribution of the semiconductor nanoparticles 221 in the nanoparticle layers 22R, 22G, and 22B to be uniform. This improves light absorption rate. Further, the nanoparticle layers 22R, 22G, and 22B in which the semiconductor nanoparticles 221 are arranged densely has higher carrier mobility.

For example, respective hole transfer layers (not illustrated) may be provided between the nanoparticle layer 22R and the second electrode 23R, between the nanoparticle layer 22G and the second electrode 23G, and between the nanoparticle layer 22B and the second electrode 23B. The hole transfer layers are for accelerating supply of the holes generated in the nanoparticle layers 22R, 22G, and 22B to the second electrodes 23R, 23G, and 23B, and may be configured, for example, of molybdenum oxide ($MoO_3$), nickel oxide (NiO), vanadium oxide ($V_2O_5$), or the like. The hole transfer layers may be configured of an organic material such as PEDOT (Poly(3,4-ethylenedioxythiophene)) and TPD (N,N'-bis(3-methylphenyl)-N,N'-diphenylbenzidine)). The hole transfer layer may have a thickness, for example, from about 0.5 nm to about 100 nm.

The second electrodes 23R, 23G, and 23B are for extracting holes generated in the nanoparticle layers 22R, 22G, and 22B, respectively. The holes extracted by the second electrodes 23R, 23G, and 23B may be exhausted, for example, to a p-type semiconductor region (not illustrated) inside the silicon substrate 11 via respective transmission paths (not illustrated). The second electrodes 23R, 23G, and 23B may be configured, for example, of a conductive material such as gold (Au), silver (Ag), copper (Cu), and aluminum (Al). As with the first electrodes 21R, 21G, and 21B, the second electrodes 23R, 23G, and 23B may be configured of a transparent conductive material. In the photoelectric conversion device 10, because the holes extracted by the second electrodes 23R, 23G, and 23B are to be exhausted, the second electrodes 23R, 23G, and 23B may be provided to be shared by the respective photoelectric conversion devices 10 (the pixels P illustrated in FIG. 19) when a plurality of photoelectric conversion devices 10 are arranged (for example, an imaging unit 1 illustrated in FIG. 19 described later). The second electrodes 23R, 23G, and 23B may each have a thickness, for example, from about 0.5 nm to about 100 nm.

The insulating layer 24 is for insulating between the second electrode 23R and the first electrode 21G. The insulating layer 25 is for insulating between the second electrode 23G and the first electrode 21B. The insulating layers 24 and 25 may be configured, for example, of a metal oxide, a metal sulfide, or an organic substance. Examples of the metal oxide may include silicon oxide ($SiO_2$), aluminum oxide ($Al_2O_3$), zirconium oxide ($ZrO_2$), titanium oxide ($TiO_2$), zinc oxide (ZnO), tungsten oxide ($WO_3$), magnesium oxide (MgO), niobium oxide ($Nb_2O_3$), tin oxide ($SnO_2$), and gallium oxide ($Ga_2O_3$). Examples of the metal sulfide may include zinc sulfide (ZnS) and magnesium sulfide (MgS). The band gap of the material configuring each of the insulating layers 24 and 25 may be preferably 3.0 eV or more. The insulating layers 24 and 25 may each have a thickness, for example, from about 2 nm to about 100 nm.

The protective layer 31 that covers the second electrode 23B is for preventing intrusion of water, etc. into the red photoelectric conversion section 20R, the green photoelectric conversion section 20G, and the blue photoelectric conversion section 20B. The protective layer 31 may be configured of a light transmissive material. For example, a single film of silicon nitride, silicon oxide, silicon oxynitride, or the like, or a laminated film thereof may be used as such a protective layer 31.

The on-chip lens 33 is provided on the protective layer 31 with the planarization layer 32 in between. The planarization layer 32 may be configured, for example, of an acrylic-based resin material, a styrene-based resin material, an epoxy-based resin material, or the like. The planarization layer 32 may be provided on as-necessary basis, and the protective layer 31 may also serve as the planarization layer 32. The on-chip lens 33 condenses light, that has entered thereabove, onto respective light receiving surfaces of the red photoelectric conversion section 20R, the green photoelectric conversion section 20G, and the blue photoelectric conversion section 20B.

[Method of Manufacturing Photoelectric Conversion Device 10]

The photoelectric conversion device 10 as described above may be manufactured as follows, for example.

First, the red electron accumulation layer 110R, the green electron accumulation layer 110G, and the blue electron accumulation layer 110B are formed in the silicon substrate 11 by ion injection. At this time, the pixel transistor is also formed in the silicon substrate 11. Subsequently, electrodes for electrically connecting the red electron accumulation layer 110R, the green electron accumulation layer 110G, and the blue electron accumulation layer 110B to the first electrodes 21R, 21G, and 21B are formed on the silicon substrate 11. Thereafter, a silicon oxide film may be formed, for example, by a plasma CVD (Chemical Vapor Deposition) method to form the insulating layer 12. A plug that reaches the electrode is formed in the insulating layer 12.

Subsequently, the red photoelectric conversion section 20R, the insulating layer 24, the green photoelectric conversion section 20G, the insulating layer 25, and the blue photoelectric conversion section 20B are formed in order on the insulating layer 12. Specifically, first, the first electrode 21R is formed. The first electrode 21R may be formed, for example, by forming an ITO film by a sputtering method, patterning the formed ITO film by photolithography technique, and performing dry etching or wet etching thereon. Subsequently, for example, the electron transfer layer configured of titanium oxide may be provided on the first electrode 21R, and then, the nanoparticle layer 22R is formed. The nanoparticle layer 22R may be formed, for example, by applying ink that includes the semiconductor nanoparticles 221 and the adsorption molecules 222 on the electron transfer layer by a wet film formation method, and performing a heat process thereon. Examples of the wet film formation method may include a spin coating method, a spray coating method, and a dip coating method. The heat process may be performed in atmosphere, under nitrogen ($N_2$) atmosphere, or under argon (Ar) atmosphere, for example, at about 100° C. for about 30 minutes. The ink may be formed by stirring the adsorption molecules 222 and the material configuring the semiconductor nanoparticles 221 in a solvent, for example, at temperature in a range from ambient temperature to about 100° C., for from about 30 minutes to several days. The ink corresponds to a specific but not limitative example of the dispersion material of an embodiment of the present application. As the solvent of the ink, a material that has a relatively-small dielectric constant, i.e., a material that has a small polarity may be preferably used. For example, a substance that includes a benzene ring and a polar group, specifically, toluene or the like may be preferably used as the solvent. Alternatively, after applying the ink onto the electron transfer layer, a polymerization reaction may be initiated by applying light or by heating for causing the side chains (the side chains 222S illustrated in FIG. 6) of the adsorption molecules 222 to be polymerized with one another. After providing the nanoparticle layer 22R, for example, a film of molybdenum oxide or nickel oxide may be formed to form the hole transfer layer. Subsequently, a conductive film is formed on the hole transfer layer by a vacuum deposition method to form the second electrode 23R. Thus, the red photoelectric conversion section 20R is formed. After providing the red photoelectric conversion section 20R, the green photoelectric conversion section 20G is formed with the insulating layer 24 in between, in a manner similar to that of the red photoelectric conversion section 20R. After providing the green photoelectric conversion section 20G, the blue photoelectric conversion section 20B is formed with the insulating layer 25 in between, in a manner similar to that of the red photoelectric conversion section 20R.

After providing the blue photoelectric conversion section 20B, the protective layer 31 is formed on the second electrode 23B of the blue photoelectric conversion section 20B. The protective layer 31 may be formed, for example, by forming a film of silicon nitride or silicon oxide by a plasma CVD method, then subjecting the formed film to patterning by a photolithography technique and dry etching, and lastly removing a deposited material and residuals by a post-process such as ashing and organic washing.

After forming the protective layer 31, the planarization layer 32 and the on-chip lens 33 are formed in order on the protective layer 31. By the above-described steps, the photoelectric conversion device 10 illustrated in FIG. 1 is completed.

[Operation of Photoelectric Conversion Device 10]

Figure 10:
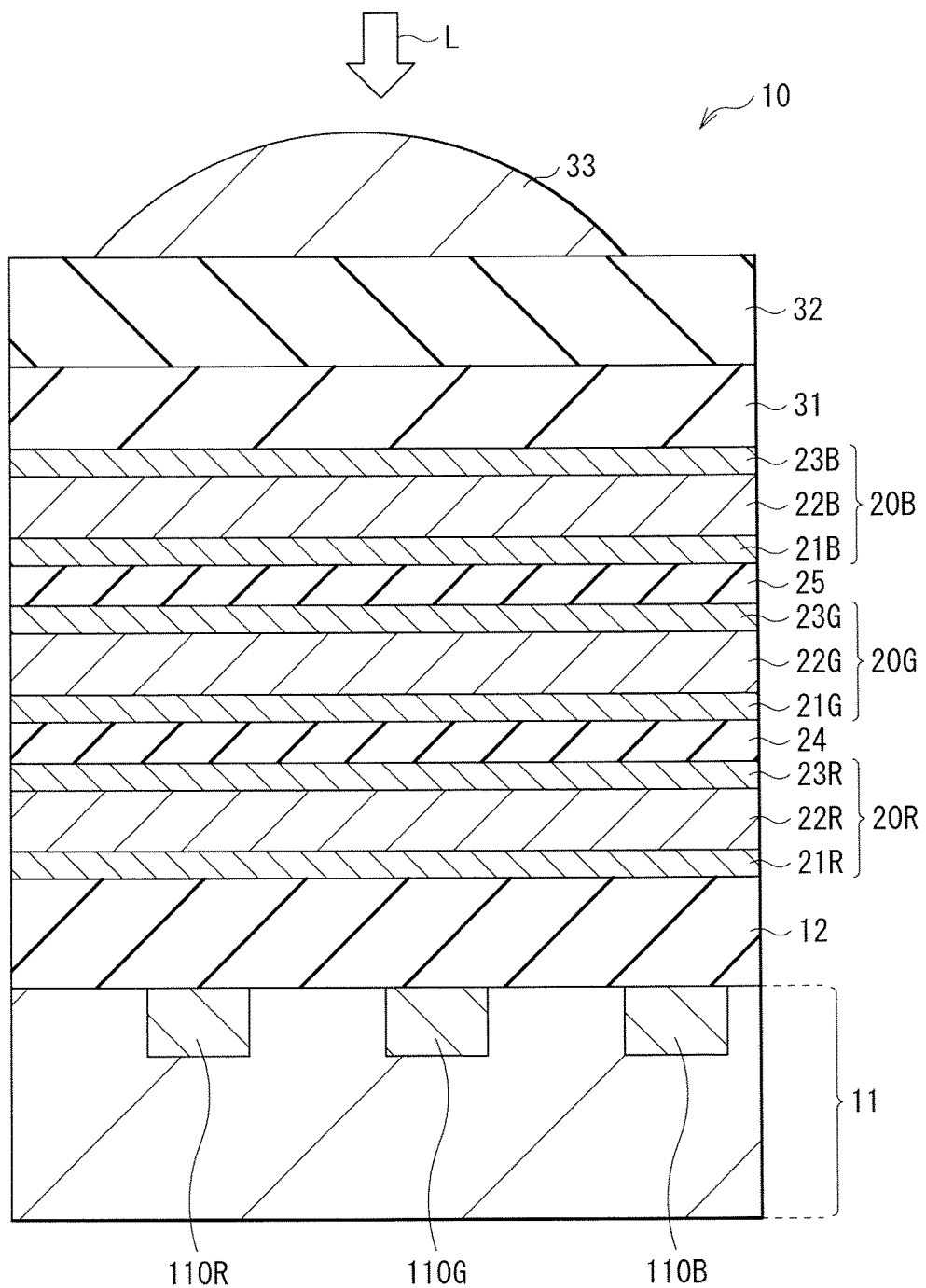
FIG. 10 is a cross-sectional view for explaining about an operation of the photoelectric conversion device illustrated in FIG. 1.
Figure 11:
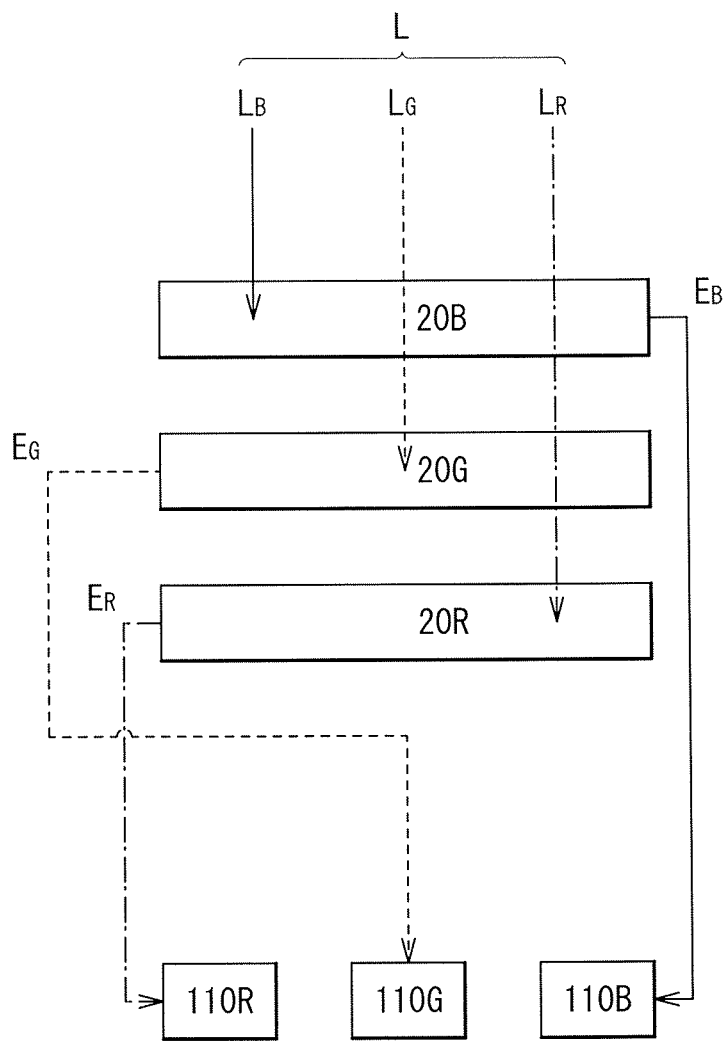
FIG. 11 is a schematic diagram for explaining about the operation of the photoelectric conversion device illustrated in FIG. 1.

Such a photoelectric conversion device 10 may be used, for example, as a pixel of an imaging unit, and a signal charge (an electron) may be acquired as follows in the photoelectric conversion device 10. After entering the on-chip lens 33 (FIG. 10), light L passes through the blue photoelectric conversion section 20B, the green photoelectric conversion section 20G, and the red photoelectric conversion section 20R in order, and is subjected to photoelectric conversion for light of respective colors of blue, green, and red while passing therethrough. In detail, as illustrated in FIG. 11, first, blue light $L_B$ out of the light L that has entered the photoelectric conversion device 10 is selectively detected (absorbed) in the blue photoelectric conversion section 20B, and is subjected to photoelectric conversion. An electron $E_B$ out of a pair of an electron and a hole generated in the blue photoelectric conversion section 20B is extracted from the first electrode 21B and the extracted electron $E_B$ is accumulated in the blue electron accumulation layer 110B. The accumulated electron $E_B$ is transferred to the floating diffusion in the pixel transistor at the time of a reading operation. On the other hand, the hole is exhausted from the second electrode 23B. In a similar manner, green light $L_G$ out of the light that has passed through the blue photoelectric conversion section 20B is selectively detected in the green photoelectric conversion section 20G, and is subjected to photoelectric conversion. An electron $E_G$ out of a pair of an electron and a hole generated in the green photoelectric conversion section 20G is extracted from the first electrode 21G and the extracted electron $E_G$ is accumulated in the green electron accumulation layer 110G. Red light $L_R$ out of the light that has passed through the blue photoelectric conversion section 20B and the green photoelectric conversion section 20G is selectively detected in the red photoelectric conversion section 20R, and is subjected to photoelectric conversion. An electron $E_R$ out of a pair of an electron and a hole generated in the red photoelectric conversion section 20R is extracted from the first electrode 21R and the extracted electron $E_R$ is accumulated in the red electron accumulation layer 110R.

[Functions and Effects of Photoelectric Conversion Device 10]

In the photoelectric conversion device 10, the adsorption molecules 222 that selectively absorb light having a predetermined wavelength are adsorbed to the semiconductor nanoparticles 221 in each of the nanoparticle layers 22R, 22G, and 22B. Accordingly, it is possible to improve light absorption rate per unit volume of the red photoelectric conversion section 20R with respect to red light, that of the green photoelectric conversion section 20G with respect to green light, and that of the blue photoelectric conversion section 20B with respect to blue light. This is described below.

Compared to an organic material such as a dye or a pigment, etc. the semiconductor nanoparticle has a lower light absorption coefficient with respect to visible light. When the semiconductor nanoparticles are arranged in a closest packed state, the volume of the semiconductor nanoparticles is about 70% of the bulk volume thereof, and the volume corresponding to about 30% of the bulk volume thereof is hollow. For this reason, it may not be possible to increase light absorption rate per unit volume in the photoelectric conversion section formed of the semiconductor nanoparticles. Accordingly, it is difficult to reduce the thickness of the nanoparticle layer.

On the other hand, in the photoelectric conversion device 10, the adsorption molecules 222 that selectively absorb light having a predetermined wavelength are used in addition to the semiconductor nanoparticles 221 to configure each of the nanoparticle layers 22R, 22G, and 22B. The volume occupied by the adsorption molecules 222 is smaller than that of the semiconductor nanoparticles 221, and the volume of the adsorption molecules 222 is sufficiently smaller than the volume of the nanoparticle layers 22R, 22G, and 22B. Accordingly, light absorption rate per unit volume is increased compared to the case where the nanoparticle layer is configured of only the semiconductor nanoparticles.

Also, the adsorption molecule 222 is aligned to be non-parallel to the direction from the center portion 221C of the semiconductor nanoparticle 221 toward the adsorption portion A thereof, or may be preferably aligned to be almost perpendicular thereto (FIG. 4). In such nanoparticle layers 22R, 22G, and 22B, a distance between adjacent semiconductor nanoparticles 221 (for example, the inter-particle distance D illustrated in FIG. 9) is shorter than that in a nanoparticle layer in which the adsorption molecule 222 is aligned to be parallel to the direction from the center portion 221C of the semiconductor nanoparticle 221 toward the adsorption portion A thereof. Accordingly, in the nanoparticle layers 22R, 22G, and 22B, the semiconductor nanoparticles 221 are arranged densely, which makes it easier for distribution of the semiconductor nanoparticles 221 in the nanoparticle layers 22R, 22G, and 22B to be uniform. In such a manner, the light absorption rate is further improved in the nanoparticle layers 22R, 22G, and 22B in which the semiconductor nanoparticles 221 are distributed uniformly.

Figure 12:
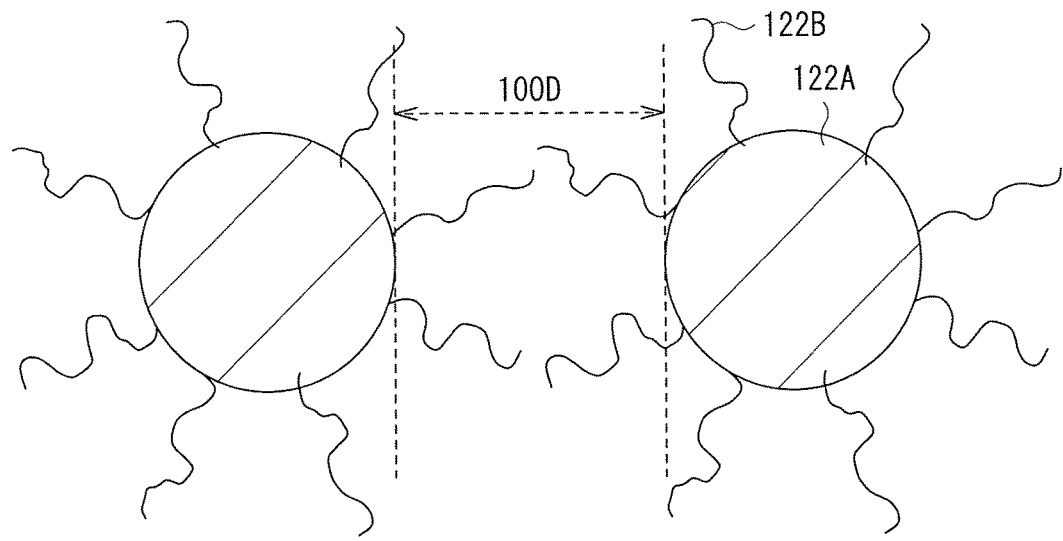
FIG. 12 is a schematic diagram illustrating a configuration of a nanoparticle layer according to a comparative example.

Moreover, by aligning the adsorption molecule 222 that has the planar molecule structure as described above, it is possible to improve the light absorption rate also compared to a case where the adsorption molecule is configured of a long molecule that has an alkyl chain or the like (FIG. 12 described later). This is described below.

FIG. 12 illustrates a cross-sectional configuration of a semiconductor nanoparticle 112A to which an alkyl chain 122B is adsorbed. The alkyl chain 122B is a molecule that absorbs little visible light. Such an alkyl chain 122B may be configured of a molecule having large carbon number. One reason for this is because the alkyl chain 122B having large carbon number is easily dispersed to an organic solvent, and makes it easy to prepare the ink for forming the nanoparticle layer. However, when such an alkyl chain 122B having large carbon number is used, a distance (an inter-particle distance 100D) between adjacent semiconductor nanoparticles becomes long. Also, when a substitution process of the alkyl chain 122B is performed after application of the ink, the alkyl chain 122B is desorbed from the semiconductor nanoparticles 122A. The substitution process of the alkyl chain 122B is performed in order to reduce the inter-particle distance 100D in the formed film and to improve mobility in the film. In the substitution process of the alkyl chain 122B, the alkyl chain 122B is substituted by a molecule that has a shorter molecule length. The semiconductor nanoparticles are aggregated thereby, and a gap or a crack may be caused in the nanoparticle layer. As described above, it is difficult to achieve sufficient light absorption rate in the nanoparticle layer in which the distribution of the semiconductor nanoparticles is not uniform.

Moreover, in a case where the nanoparticle layer is formed to have a thickness, for example, of about 500 nm in order to achieve sufficient light absorption rate, it is difficult to substitute the alkyl chains 122B for all of the semiconductor nanoparticles 122A in one-time substitution process described above. Accordingly, for example, the nanoparticle layer having a desirable thickness may be formed by repeatedly performing film formation and the substitution process by 50 nm, which increases the number of steps.

On the other hand, in the nanoparticle layers 22R, 22G, and 22B, the adsorption molecules 222 configured of molecules having a planar molecule structure are used, and the semiconductor nanoparticles 221 are thereby densely arranged. Accordingly, the substitution process of the adsorption molecules 222 after the application of the ink is not necessary either. As a result, it is possible to prevent generation of a gap in the nanoparticle layers 22R, 22G, and 22B, and to improve light absorption rate. The number of steps is not increased either.

Moreover, in the nanoparticle layer 22R, 22G, and 22B, mobility of electrons of the adsorption molecule 222 is lower than mobility of electrons (signal charges) of the semiconductor nanoparticle 221. Accordingly, by densely arranging the semiconductor nanoparticles 221, a distance for the electrons to move in the adsorption molecules 222 is made shorter, which improves the mobility of the electrons. It is also possible to thereby increase conductivity.

Moreover, because the adsorption molecule 222 has heat tolerance, the adsorption molecule 222 is less likely to be desorbed from the semiconductor nanoparticle 221. When the adsorption molecules 222 are desorbed, the semiconductor nanoparticles 221 may be aggregated. By using the adsorption molecules 222 having high heat tolerance, it is possible to prevent generation of a gap resulting from such aggregation of the semiconductor nanoparticles 221 and to improve light absorption rate. In addition thereto, when the adsorption molecules 222 are desorbed from the semiconductor nanoparticles 221, the desorbed adsorption molecules 222 may disturb movement of electrons. The adsorption molecules 222 having high heat tolerance is capable of preventing such decrease in mobility.

Moreover, because the side chain 222S of the adsorption molecule 222 includes the polymerizable group P (FIG. 6), the heat tolerance of the adsorption molecule 222 is improved. Accordingly, it is possible to improve light absorption rate in a manner similar to that described above. Also, it is possible to prevent decrease in mobility.

Moreover, the LUMO energy level of the adsorption molecule 222 may be preferably within about 0.2 eV from the energy level of the conduction band of the semiconductor material configuring the semiconductor nanoparticle 221. When the LUMO energy level of the adsorption molecule 222 is far away from the energy level of the conduction band of the semiconductor material configuring the semiconductor nanoparticle 221, it becomes more difficult for the electron excited in the semiconductor nanoparticle 221 to move to an orbit of the adsorption molecule 222. In this case, the electron excited in the semiconductor nanoparticle 221 emits light that has energy corresponding to the band gap and is deactivated. By using the adsorption molecule 222 that has LUMO energy level near the energy level of the conduction band of the semiconductor nanoparticle 221, it is possible to prevent such loss of energy and to improve photoelectric conversion efficiency. For a similar reason, the HOMO energy level of the adsorption molecule 222 may be preferably within about 0.2 eV from the energy level of the valence band of the semiconductor material configuring the semiconductor nanoparticle 221.

Figure 13A:
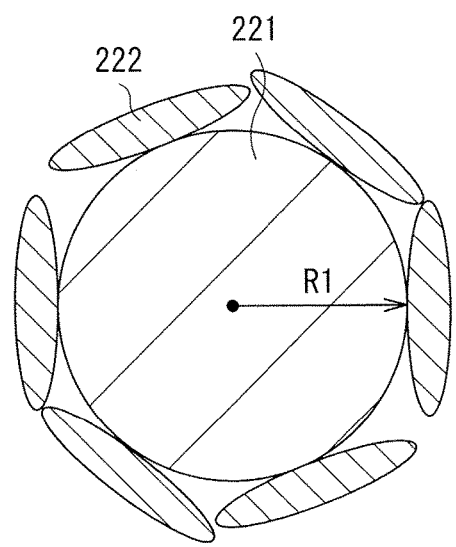
FIG. 13A is a cross-sectional view illustrating a semiconductor nanoparticle having a predetermined radius.
Figure 13B:
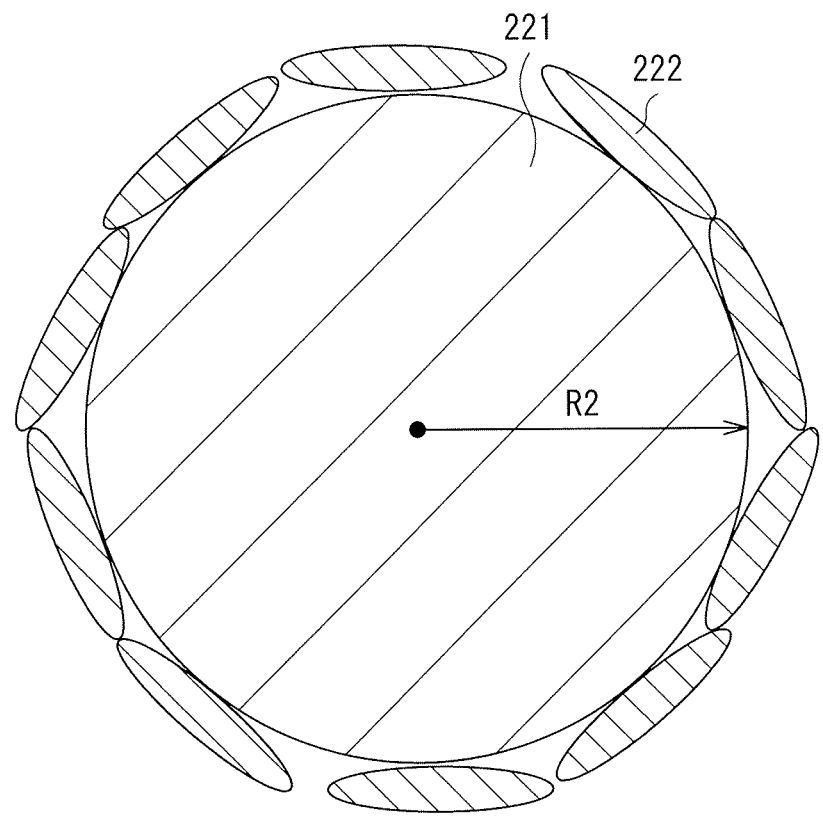
FIG. 13B is a cross-sectional view illustrating a semiconductor nanoparticle having a radius that is larger than the radius of the semiconductor nanoparticle illustrated in FIG. 13A.
Figure 13C:
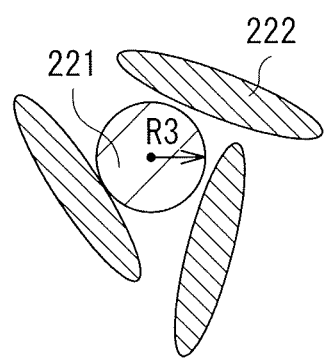
FIG. 13C is a cross-sectional view illustrating a semiconductor nanoparticle having a radius that is smaller than the radius of the semiconductor nanoparticle illustrated in FIG. 13A.

Moreover, it may be preferable to use the semiconductor nanoparticle 221 having a radius of about 1 nm or larger. FIGS. 13A, 13B, and 13C illustrate cross-sectional configurations of semiconductor nanoparticles 221 having radii different from one another. A radius (a radius R2) of the semiconductor nanoparticle 221 illustrated in FIG. 13B is larger than a radius (a radius R1) of the semiconductor nanoparticle 221 illustrated in FIG. 13A. A radius (a radius R3) of the semiconductor nanoparticle 221 illustrated in FIG. 13C is smaller than the radius R1 of the semiconductor nanoparticle 221 illustrated in FIG. 13A. As can be seen therefrom, as the radius of the semiconductor nanoparticle 221 is increased, the surface area of the semiconductor nanoparticle 221 is increased, which increases the area to which the adsorption molecule 222 is allowed to be adsorbed.

Figure 14:
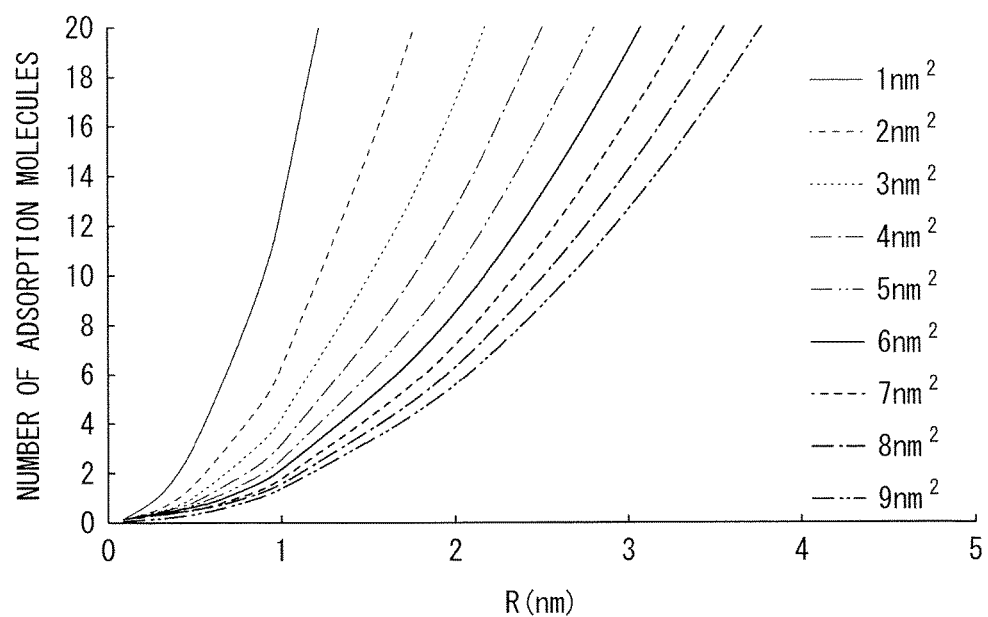
FIG. 14 is a diagram illustrating a relationship between the radius of the semiconductor nanoparticle and the number of absorbable adsorption molecules.

FIG. 14 illustrates a relationship between the radius of the semiconductor nanoparticle 221 and the number of the adsorption molecules 222 that are allowed to be adsorbed to the semiconductor nanoparticles 221. As can be clearly seen from FIG. 14, as the radius of the semiconductor nanoparticle 221 is increased, the number of the adsorption molecules 222 that are allowed to be adsorbed to the semiconductor nanoparticles 221 is increased. In a case where the adsorption molecule 222 is configured of a molecule that has a plane having the area of 1 nm$^2$, for example, phthalocyanine, when the radius of the semiconductor nanoparticle 221 is 1 nm or larger, 10 or more adsorption molecules 222 are allowed to be adsorbed.

As described above, in the present embodiment, the nanoparticle layers 22R, 22G, and 22B each include the adsorption molecules 222 that selectively absorb light having a predetermined wavelength, together with the semiconductor nanoparticles 221. Accordingly, it is possible to improve the light absorption rate of the nanoparticle layers 22R, 22G, and 22B. As a result, it is possible to improve photoelectric conversion efficiency of the red photoelectric conversion section 20R, the green photoelectric conversion section 20G, and the blue photoelectric conversion section 20B.

Also, by stacking the blue photoelectric conversion section 20B, the green photoelectric conversion section 20G, and the red photoelectric conversion section 20R in a vertical direction, it is possible to separately detect color light of red, green, and blue without providing a color filter and to obtain signal charges of the respective colors. Accordingly, it is possible to suppress light loss (decrease in sensitivity) resulting from color light absorption by the color filter, occurrence of false color accompanying a pixel interpolation process, etc.

Modifications of the above-described embodiment are described below. In the description below, the same numerals are used to designate substantially the same components in the above-described embodiment, and the description thereof is appropriately omitted.

Modification 1

Figure 15:
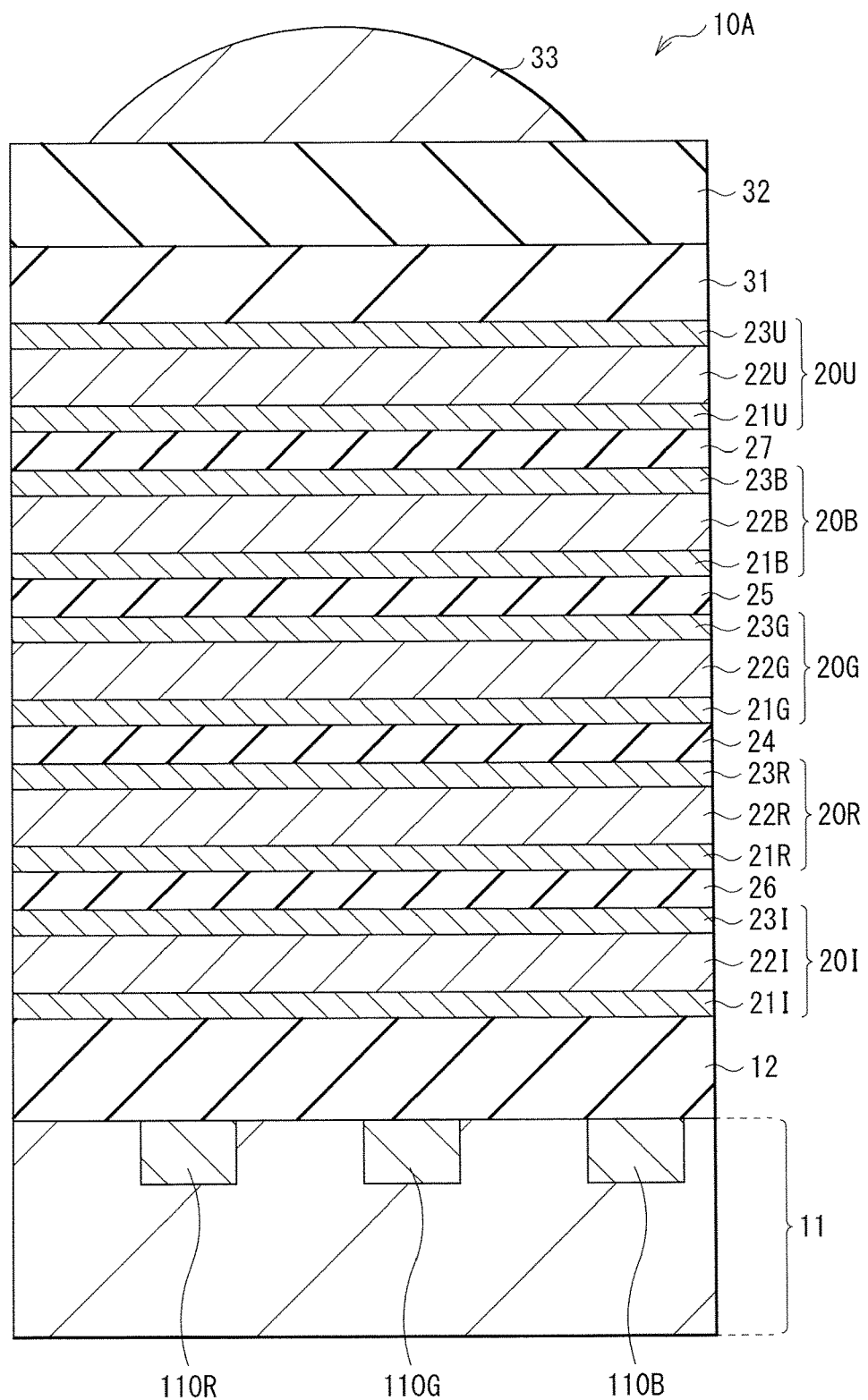
FIG. 15 is a cross-sectional view illustrating an outline configuration of a photoelectric conversion device according to Modification 1.

FIG. 15 illustrates a cross-sectional configuration of a photoelectric conversion device (a photoelectric conversion device 10A) according to Modification 1. The photoelectric conversion device 10A includes an ultraviolet photoelectric conversion section 20U between the blue photoelectric conversion section 20B and the protective layer 31, and includes an infrared photoelectric conversion section 20I between the red photoelectric conversion section 20R and the insulating layer 12. Except for this point, the photoelectric conversion device 10A has a configuration similar to that of the photoelectric conversion device 10, and has functions and effects similar to those of the photoelectric conversion device 10.

The ultraviolet photoelectric conversion section 20U absorbs ultraviolet light (for example, having a wavelength of about 500 nm or less) and performs photoelectric conversion thereon. The ultraviolet photoelectric conversion section 20U includes a first electrode 21U, a nanoparticle layer 22U, and a second electrode 23U in order from a position closer to the blue photoelectric conversion section 20B. The infrared photoelectric conversion section 20I absorbs infrared light (for example, having a wavelength from about 700 nm to about 2000 nm) and performs photoelectric conversion thereon. The infrared photoelectric conversion section 20I includes a first electrode 21I, a nanoparticle layer 22I, and a second electrode 23I in order from a position closer to the insulating layer 12.

The nanoparticle layer 22U in the ultraviolet photoelectric conversion section 20U includes a plurality of semiconductor nanoparticles 221. Molecules (adsorption molecules) that selectively absorb ultraviolet light are adsorbed to the semiconductor nanoparticles 221. The semiconductor nanoparticle 221 in the nanoparticle layer 22U selectively absorbs ultraviolet light. In the nanoparticle layer 22U, the adsorption molecule 222 may preferably have light absorption peak within a wavelength range from about 300 nm to about 400 nm, and the semiconductor nanoparticle 221 may preferably have absorption end within a wavelength range of about 500 nm or less. In the ultraviolet photoelectric conversion section 20U, light absorption coefficient of the adsorption molecule 222 with respect to ultraviolet light may be preferably larger than light absorption coefficient of the semiconductor nanoparticle 221 with respect to ultraviolet light. The ultraviolet photoelectric conversion section 20U has a configuration similar to those of the red photoelectric conversion section 20R, the green photoelectric conversion section 20G, and the blue photoelectric conversion section 20B except that the wavelength of light to be absorbed in the ultraviolet photoelectric conversion section 20U is different from the wavelengths of light to be absorbed in the red photoelectric conversion section 20R, the green photoelectric conversion section 20G, and the blue photoelectric conversion section 20B.

The nanoparticle layer 22I in the infrared photoelectric conversion section 20I includes a plurality of semiconductor nanoparticles 22I. Molecules (adsorption molecules) that selectively absorb infrared light are adsorbed to the semiconductor nanoparticles 22I. The semiconductor nanoparticle 221 in the nanoparticle layer 22I selectively absorbs infrared light. In the nanoparticle layer 22I, the adsorption molecule 222 may preferably have light absorption peak within a wavelength range from about 700 nm to about 2000 nm, and the semiconductor nanoparticle 221 may preferably have absorption end within a wavelength range from about 700 nm to about 2000 nm. In the infrared photoelectric conversion section 20I, light absorption coefficient of the adsorption molecule 222 with respect to infrared light may be preferably larger than light absorption coefficient of the semiconductor nanoparticle 221 with respect to infrared light. The infrared photoelectric conversion section 20I has a configuration similar to those of the red photoelectric conversion section 20R, the green photoelectric conversion section 20G, and the blue photoelectric conversion section 20B except that the wavelength of light to be absorbed in the infrared photoelectric conversion section 20I is different from the wavelengths of light to be absorbed in the red photoelectric conversion section 20R, the green photoelectric conversion section 20G, and the blue photoelectric conversion section 20B.

In the photoelectric conversion device 10A, first, ultraviolet light out of light that has entered the on-chip lens is selectively absorbed in the ultraviolet photoelectric conversion section 20U, and is subjected to photoelectric conversion. The light that has passed through the ultraviolet photoelectric conversion section 20U passes through the blue photoelectric conversion section 20B, the green photoelectric conversion section 20G, and the red photoelectric conversion section 20R in order, and is subjected to photoelectric conversion for light of respective colors of blue, green, and red while passing therethrough. Infrared light out of light that has passed through the ultraviolet photoelectric conversion section 20U, the blue photoelectric conversion section 20B, the green photoelectric conversion section 20G, and the red photoelectric conversion section 20R is absorbed in the infrared photoelectric conversion section 20I, and is subjected to photoelectric conversion. Such provision of the ultraviolet photoelectric conversion section 20U and the infrared photoelectric conversion section 20I makes it possible to detect an amount of light having a wavelength out of the visible light range. One of the ultraviolet photoelectric conversion section 20U and the infrared photoelectric conversion section 20I may be provided.

Modification 2

The nanoparticle layer in the photoelectric conversion section through which light passes later may include the adsorption molecule that absorbs light having a wavelength same as the wavelength of light selectively absorbed in the photoelectric conversion section through which the light passes earlier. A specific example is described below. The nanoparticle layer 22B in the blue photoelectric conversion section 20B may include the adsorption molecule 222 that selectively absorbs blue light and the absorption molecule 222 that selectively absorbs ultraviolet light. The nanoparticle layer 22G in the green photoelectric conversion section 20G may include the adsorption molecule 222 that selectively absorbs green light, the adsorption molecule 222 that selectively absorbs blue light, and the adsorption molecule 222 that selectively absorbs ultraviolet light. The nanoparticle layer 22R in the red photoelectric conversion section 20R may include the adsorption molecule 222 that selectively absorbs red light, the adsorption molecule 222 that selectively absorbs green light, the adsorption molecule 222 that selectively absorbs blue light, and the adsorption molecule 222 that selectively absorbs ultraviolet light. The nanoparticle layer 22I in the infrared photoelectric conversion section 20I may include the adsorption molecule 222 that selectively absorbs infrared light, the adsorption molecule 222 that selectively absorbs red light, the adsorption molecule 222 that selectively absorbs green light, the adsorption molecule 222 that selectively absorbs blue light, and the adsorption molecule 222 that selectively absorbs ultraviolet light.

Modification 3

Figure 16:
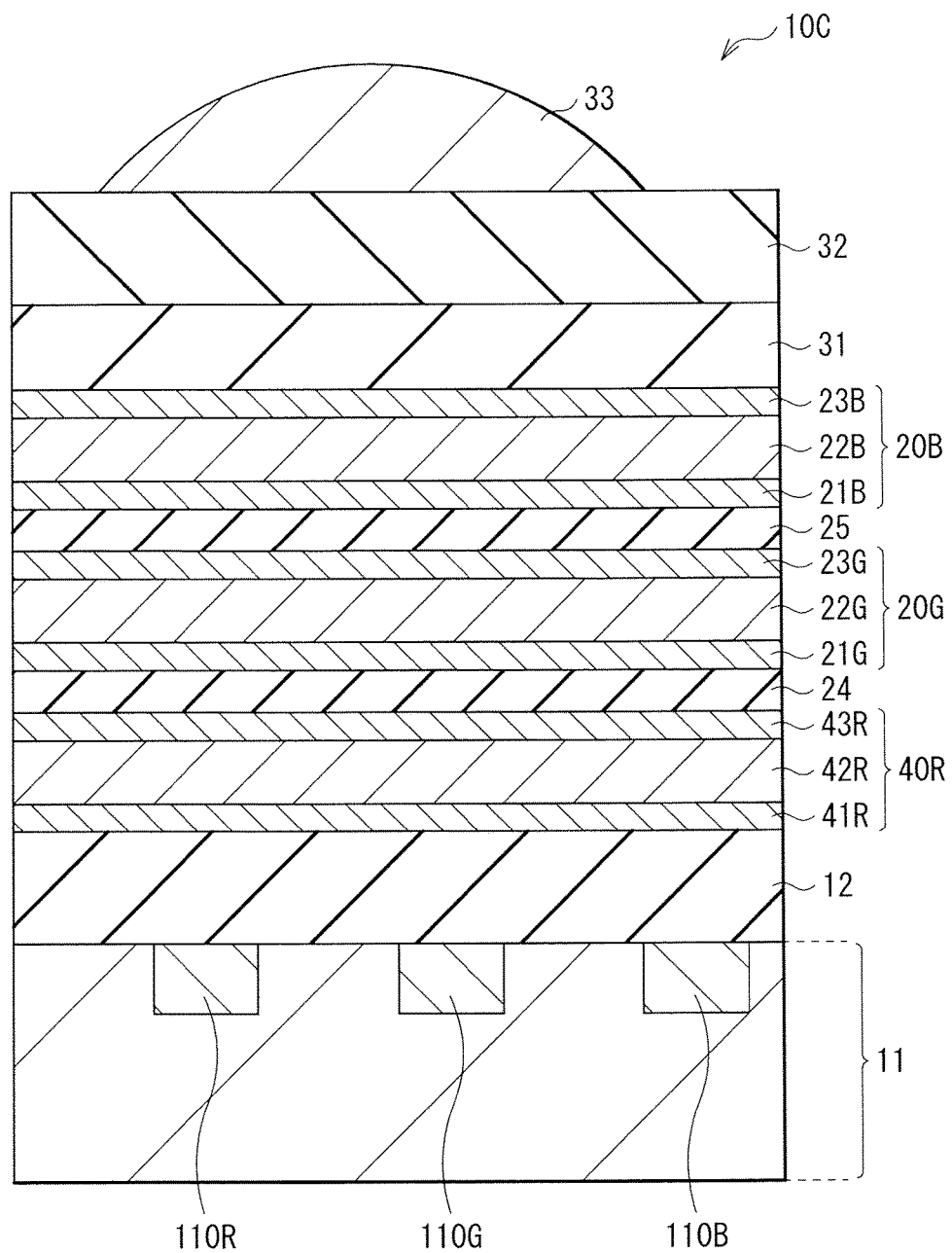
FIG. 16 is a cross-sectional view illustrating an outline configuration of a photoelectric conversion device according to Modification 3.

FIG. 16 illustrates a cross-sectional configuration of a photoelectric conversion device (a photoelectric conversion device 10C) according to Modification 3. A red photoelectric conversion section (a red photoelectric conversion section 40R) in the photoelectric conversion device 10C includes a silicon layer 42R configured of crystalline silicon (Si) between a first electrode 41R and a second electrode 43R. The silicon layer 42R selectively absorbs red light. Except for this point, the photoelectric conversion device 10C has a configuration similar to that of the photoelectric conversion device 10, and has functions and effects similar to those of the photoelectric conversion device 10.

Modification 4

Figure 17:
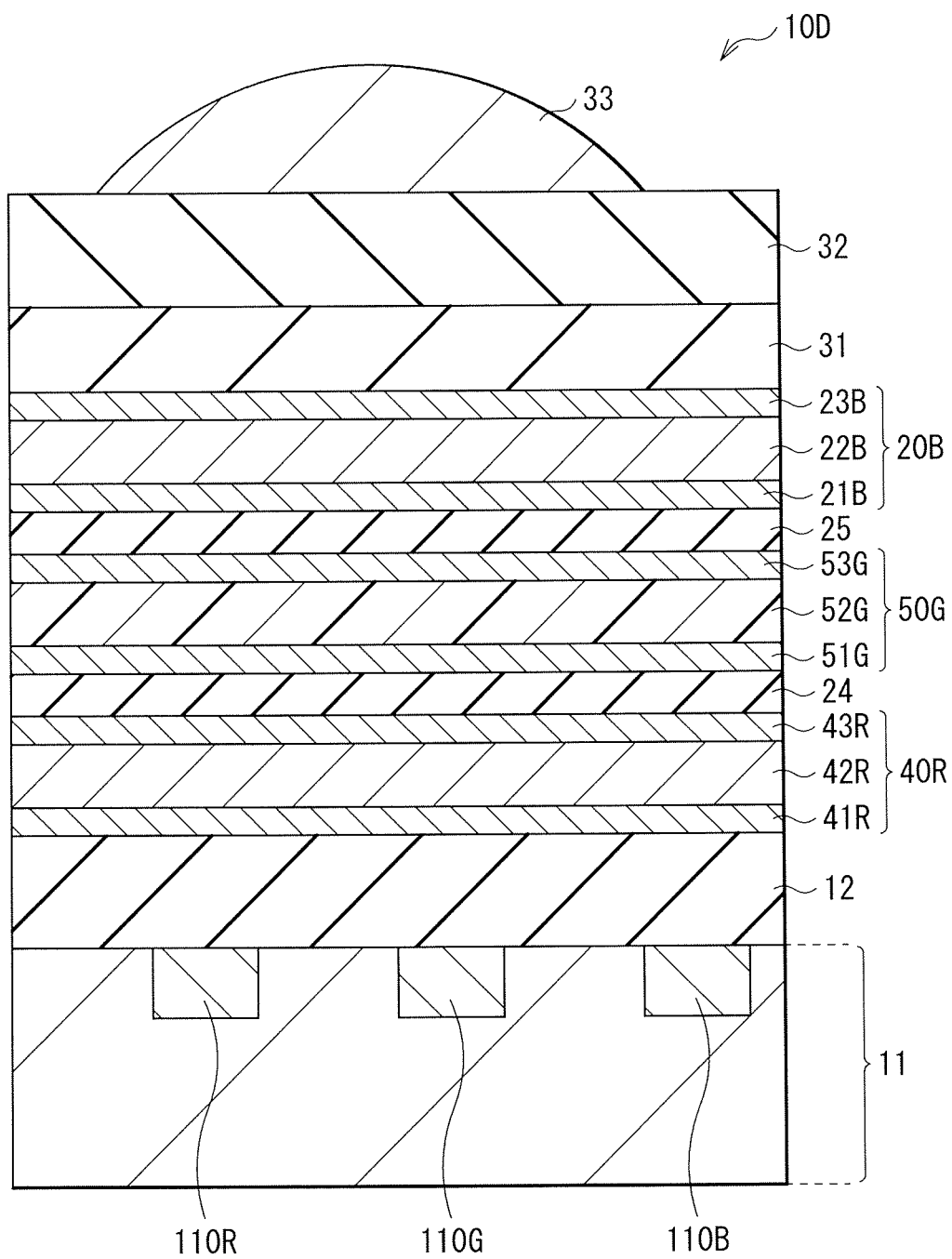
FIG. 17 is a cross-sectional view illustrating an outline configuration of a photoelectric conversion device according to Modification 4.

FIG. 17 illustrates a cross-sectional configuration of a photoelectric conversion device (a photoelectric conversion device 10D) according to Modification 4. A green photoelectric conversion section (a green photoelectric conversion section 50G) in the photoelectric conversion device 10D includes an organic layer 52G between a first electrode 51G and a second electrode 53G. Except for this point, the photoelectric conversion device 10D has a configuration similar to that of the photoelectric conversion device 10, and has functions and effects similar to those of the photoelectric conversion device 10.

The organic layer 52G may be configured of an organic semiconductor material that selectively absorbs green light. The organic layer 52G may preferably include both of an n-type semiconductor material and a p-type semiconductor material.

Each of the n-type semiconductor material and the p-type semiconductor material may be, for example, one of a quinacridone derivative, a naphthalene derivative, an anthracene derivative, a phenanthrene derivative, a tetracene derivative, a pyrene derivative, a perylene derivative, and a fluoranthene derivative. Each of an n-type semiconductor 16N and a p-type semiconductor 16P may be configured of a polymer of phenylene vinylene, fluorene, carbazole, indole, pyrene, pyrrole, picoline, thiophene, acetylene, or diacetylene, a derivative thereof, etc. Alternatively, each of the n-type semiconductor 16N and the p-type semiconductor 16P may be configured of a metal complex coloring matter, a cyanine-based coloring matter, a squarylium-based coloring matter, a merocyanine-based coloring matter, a phenylxanthene-based coloring matter, a triphenylmethane-based coloring matter, a rhodacyanine-based coloring matter, a xanthene-based coloring matter, a macrocyclic azaazulene-based coloring matter, an azulene-based coloring matter, or a naphthoquinone or anthraquinone-based coloring matter. As the metal complex pigment, a dithiol-metal-complex-based pigment, a metal phthalocyanine pigment, a metal porphyrin pigment, or a ruthenium complex pigment may be preferably used, and the ruthenium complex pigment may be particularly preferable. Each of the n-type semiconductor material and the p-type semiconductor material may be configured of a condensed polycyclic aromatic such as anthracene or pyrene, or a chain compound obtained by condensing aromatics or heterocyclic compounds. Each of the n-type semiconductor material and the p-type semiconductor material may be configured of: a compound obtained by bonding two or more nitrogen-containing heterocycles such as quinoline, benzothiazole, or benzoxazole with the use of a squarylium group and a croco nick methine group as a bonding chain; cyanine-based-similar coloring matters bonded by a squarylium group and a croco nick methine group; or the like.

The red photoelectric conversion section in the photoelectric conversion device 10D may be configured of the red photoelectric conversion section 40R (FIG. 16) that includes the silicon layer 42R, or may be configured of the red photoelectric conversion section 20R (FIG. 1) that includes the nanoparticle layer 22R.

Modification 5

Figure 18:
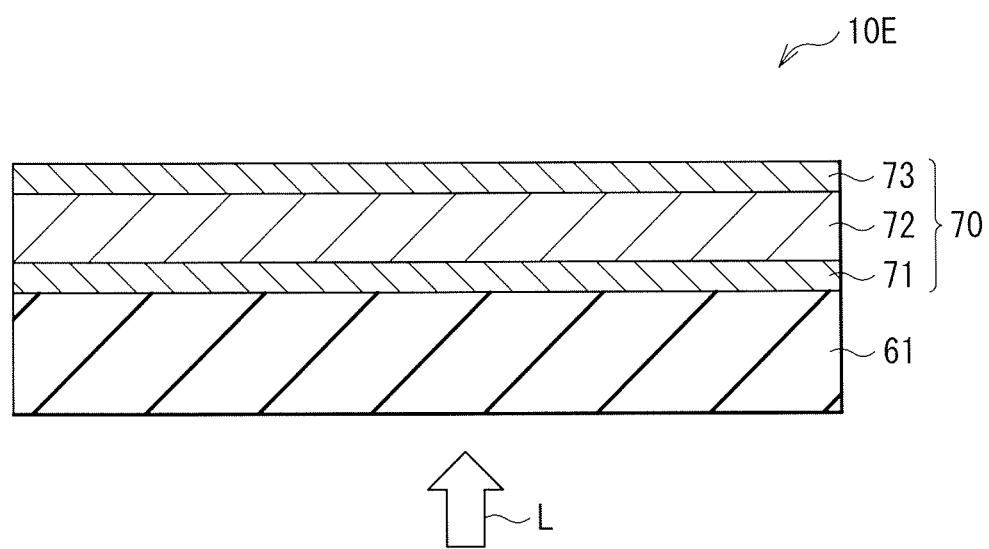
FIG. 18 is a cross-sectional view illustrating an outline configuration of a photoelectric conversion device according to Modification 5.

FIG. 18 illustrates a cross-sectional configuration of a photoelectric conversion device (a photoelectric conversion device 10E) according to Modification 5. The photoelectric conversion device 10E includes a photoelectric conversion section 70 on a glass substrate 61. The light L enters the photoelectric conversion section 70 via the glass substrate 61. Except for this point, the photoelectric conversion device 10E has a configuration similar to that of the photoelectric conversion device 10, and has functions and effects similar to those of the photoelectric conversion device 10.

The photoelectric conversion section 70 selectively absorbs visible light and performs photoelectric conversion thereon. The photoelectric conversion section 70 includes a first electrode 71, a nanoparticle layer 72, and a second electrode 73 in order from a position closer to the glass substrate 61. The first electrode 71 may be configured, for example, of a conductive material that has high light transmittance. The second electrode 73 may be configured, for example, of a light reflective conductive material. The light L may be separated by a color filter (not illustrated), and then, the separated light may be caused to enter the photoelectric conversion section 70.

In the photoelectric conversion device 10E, the light L enters from the glass substrate 61. The entered light L passes through the glass substrate 61 and the first electrode 71, and reaches the nanoparticle layer 72. In the nanoparticle layer 72, light having a predetermined wavelength is absorbed, and the absorbed light is subjected to photoelectric conversion. The light that has not been absorbed in the nanoparticle layer 72 and has passed therethrough is reflected by the second electrode 73 and travels toward the nanoparticle layer 72. The light that has not been absorbed again in the nanoparticle layer 72 may be extracted to outside via the first electrode 71 and the glass substrate 61, for example.

Application Example

Figure 19:
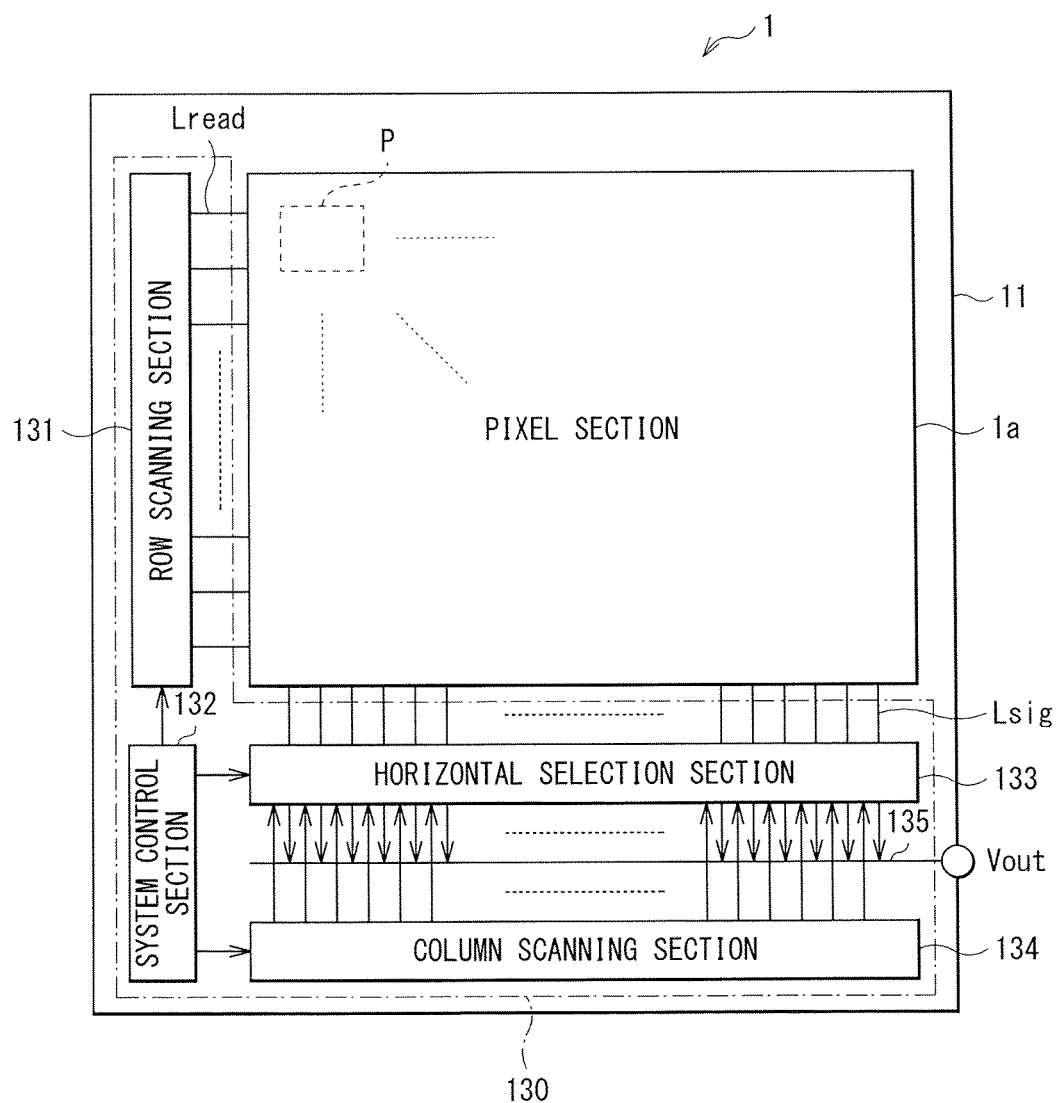
FIG. 19 is a diagram illustrating an outline configuration of an imaging unit that includes the photoelectric conversion device illustrated in FIG. 1, etc.

FIG. 19 illustrates a general configuration of a solid-state imaging unit (an imaging unit 1) in which any of the photoelectric conversion devices (the photoelectric conversion devices 10, 10A, 10C, 10D, and 10E) described above in the embodiment and the modifications is used for each pixel. The imaging unit 1 is a CMOS image sensor, and includes a pixel section 1a as an imaging area in a center portion on the semiconductor substrate 11. For example, a peripheral circuit section 130 that may include a row scanning section 131, a system control section 132, a horizontal selection section 133, and a column scanning section 134 may be provided in a peripheral region of the pixel section 1a.

The pixel section 1a may include, for example, a plurality of unit pixels P (each corresponding to any of the photoelectric conversion devices 10 and 10A) that may be arranged two-dimensionally in a matrix. For the unit pixels P, for example, a pixel drive line Lread (specifically, a row selection line and a reset control line) may be wired for each pixel row, and a vertical signal line Lsig may be wired for each pixel column. The pixel drive line Lread transmits a drive signal for reading a signal from the pixel. An end of the pixel drive line Lread is connected to an output end corresponding to each row of the row scanning section 131.

The row scanning section 131 may be configured, for example, of a shift register, an address decoder, and/or the like, and may be a pixel drive section that may drive the respective pixels P in the pixel section 1a on a row unit basis. A signal outputted from the respective pixels P in the pixel row selected by the row scanning section 131 is supplied to the horizontal selection section 133 via each of the vertical signal lines Lsig. The horizontal selection section 133 may be configured, for example, of amplifiers, horizontal selection switches, etc. that are provided for the respective vertical signal lines Lsig.

The column scanning section 134 may be configured, for example, of a shift register, an address decoder, and/or the like, and sequentially drive the respective horizontal selection switches in the horizontal selection section 133 while scanning the respective horizontal selection switches. Due to the selection scanning performed by the column scanning section 134, the signals from the respective pixels P to be transmitted via the respective vertical signal lines Lsig are outputted to the horizontal signal line 135, and the outputted signals are transmitted to the outside of the semiconductor substrate 11 via the horizontal signal line 135.

A circuit portion including the row scanning section 131, the horizontal selection section 133, the column scanning section 134, and the horizontal signal line 135 may be formed directly on the semiconductor substrate 11, or may be provided in an external control IC. Alternatively, the circuit portion may be provided on another substrate connected to the imaging unit 1 with the use of a cable or the like.

The system control section 132 receives a clock supplied from the outside of the semiconductor substrate 11, data instructing an operation mode, etc. and outputs internal information of the imaging unit 1. In addition thereto, the system control section 132 may include, for example, a timing generator that generates various timing signals, and thereby controls drive of the peripheral circuits such as the row scanning section 131, the horizontal selection section 133, and the column scanning section 134 based on the various timing signals generated by the timing generator.

Figure 20:
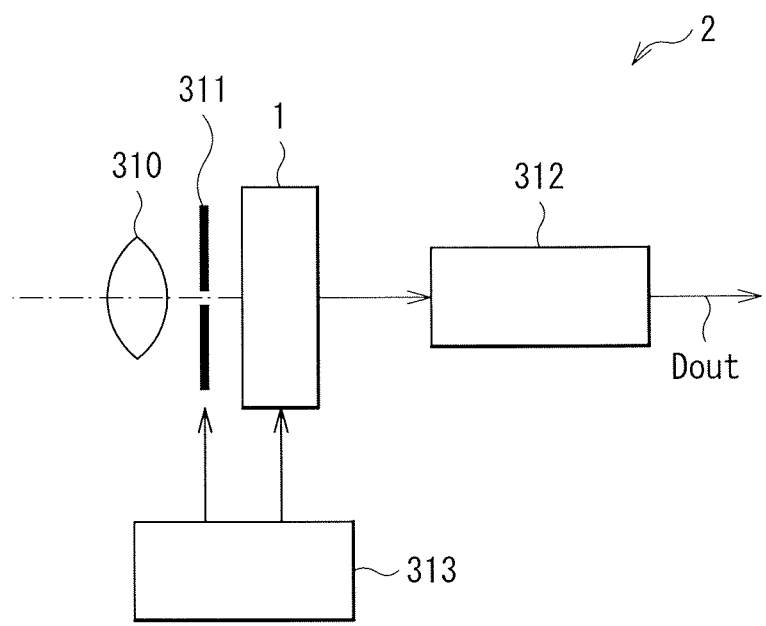
FIG. 20 is a diagram illustrating an outline configuration of an electronic apparatus to which the imaging unit illustrated in FIG. 19 is applied.

Such an imaging unit 1 may be mounted on an electronic apparatus of any type that has an imaging function. For example, the imaging unit 1 may be applied to a camera system such as a digital still camera or a video camcorder, a mobile phone, etc. FIG. 20 illustrates an outline configuration of a camera (an electronic apparatus 2) as an example thereof. The electronic apparatus 2 may be a video camcorder that is capable of shooting a still image or a moving image. The electronic apparatus 2 may include, for example, an optical system (an optical lens) 310, a shutter unit 311, a signal processing section 312, and a drive section 313.

The optical system 310 guides image light (entering light) from a subject to the pixel section 1a in the imaging unit 1. The optical system 310 may include a plurality of optical lenses. The shutter unit 311 controls periods of light application and light blocking with respect to the imaging unit 1. The drive section 313 controls a shutter operation of the shutter unit 311 and a transfer operation of the imaging unit 1. The signal processing section 312 performs various signal processes on a signal outputted from the imaging unit 1. A picture signal Dout after the signal processes may be stored in a storage medium such as a memory, or may be outputted to a monitor or the like, for example.

Example

Next, Example of the present application is described in detail.

Example

A photoelectric conversion section was fabricated by the following procedure.

First, the first electrode made of indium-doped tin oxide was formed, and then, the electron transfer layer made of titanium oxide was formed on the first electrode. Thereafter, the nanoparticle layer was formed. The nanoparticle layer was formed as follows. First, 0.1 g of ZnSe was weighed as the semiconductor nanoparticles. 50 mL of toluene was added as a solvent to the weighed ZnSe. 0.01 g of phthalocyanine as the adsorption molecules and 0.01 g of octadecylamine which was a semiconductor nanoparticle dispersion adjuvant were added to the solvent including the semiconductor nanoparticles, which was stirred with the use of a stirrer at 500 rpm for 12 hours. As the phthalocyanine, phthalocyanine that included, as a substituent group (at least one of Z1 to Z15 in Formula (1)), an alkyl group (C=10)

including at least one sulfur atom (S) was used. The stirring temperature was set as room temperature. The dispersion solution including the semiconductor nanoparticles and the adsorption molecules was applied onto the first electrode, and the heat process was performed thereon to form the nanoparticle layer. The heat process was performed under nitrogen ($N_2$) atmosphere, at 100° C., for 30 minutes. After providing the nanoparticle layer, the hole transfer layer made of molybdenum oxide and the second electrode made of indium-doped tin oxide were formed in order.

Artificial sun light (AM1.5, 5,100 mW/cm$^2$) was applied to the thus-fabricated photoelectric conversion section (Example), and energy conversion efficiency was measured. Also, photon-electron conversion efficiency (external quantum efficiency) was measured with the use of light obtained by monochromatically narrowing an artificial sun-light light source.

Reference Example

A photoelectric conversion section was fabricated in a manner similar to that described above except that phthalocyanine was not added as the adsorption molecule (Reference example). Energy conversion efficiency and photon-electron conversion efficiency of the photoelectric conversion section were measured in a manner similar to that described above.

Comparing the photoelectric conversion section of Example to the photoelectric conversion section of Reference example, in the photoelectric conversion section in Example, both of the energy conversion efficiency and the photon-electron conversion efficiency were improved compared to those in Reference example. In such a manner, it is confirmed that the energy conversion efficiency and the photon-electron conversion efficiency are improved by increasing the light absorption rate of the nanoparticle layer.

The present application has been described above referring to the embodiment and the modifications. However, the present application is not limited to the above-described embodiment and the like, and may be variously modified. For example, the case where the green photoelectric conversion section 50G includes the organic layer 52G has been described above in Modification 3 (FIG. 17). However, the blue photoelectric conversion section may include the organic layer. Alternatively, the blue photoelectric conversion section may include the nanoparticle layer, and the green photoelectric conversion section and the red photoelectric conversion section may each include the organic layer.

Moreover, the photoelectric conversion device in which the red photoelectric conversion section 20R, the green photoelectric conversion section 20G, and the blue photoelectric conversion section 20B are laminated has been described in the above embodiment and the like. However, the photoelectric conversion device may be configured of two photoelectric conversion sections. Alternatively, the photoelectric conversion device may be configured of a photoelectric conversion section of a single layer. The lamination order of the red photoelectric conversion section 20R, the green photoelectric conversion section 20G, and the blue photoelectric conversion section 20B may be changed.

Also, it is not necessary to include all of the components described above in the embodiment and the like, and other component may be also included.

It is to be noted that the effects described herein are mere examples. The effects of the present application are not limited thereto and may include other effects.

It is possible to achieve at least the following configurations from the above-described example embodiments and the modifications of the disclosure.

(1) A dispersion material including:
a plurality of semiconductor nanoparticles; and
an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

(2) The dispersion material according to (1), wherein the adsorption molecule has a planar molecule structure.

(3) The dispersion material according to (1) or (2), wherein LUMO of the adsorption molecule is within a range of 0.2 energy volts or less from energy level of conduction band of the plurality of semiconductor nanoparticles.

(4) The dispersion material according to any one of (1) to (3), wherein HOMO of the adsorption molecule is within a range of 0.2 energy volts or less from energy level of valence band of the plurality of semiconductor nanoparticles.

(5) The dispersion material according to any one of (1) to (4), wherein the plurality of semiconductor particles are configured of one of $TiO_2$, ZnO, $WO_3$, NiO, $MoO_3$, CuO, $Ga_2O_3$, $SrTiO_3$, $SnO_2$, $InSnO_x$, $Nb_2O_3$, $MnO_2$, $V_2O_3$, CrO, $CuInSe_2$, $CuInS_2$, $AgInS_2$, Si, PbS, PbSe, PbTe, CdS, CdSe, CdTe, $Fe_2O_3$, GaAs, GaP, InP, InAs, Ge, $In_2S_3$, $Bi_2S_3$, ZnSe, ZnTe, and ZnS.

(6) The dispersion material according to any one of (1) to (5), wherein the plurality of semiconductor nanoparticles each have a radius of about 1 nanometer or larger.

(7) The dispersion material according to any one of (1) to (6), wherein the adsorption molecule is one of an organic molecule and a metal complex molecule that are used as one of a pigment and a dye.

(8) The dispersion material according to any one of (1) to (7), wherein the adsorption molecule includes a polymerizable functional group.

(9) The dispersion material according to any one of (1) to (7), wherein the adsorption molecule includes one of an unsaturated ethylene group and a cyclic ether group.

(10) The dispersion material according to any one of (1) to (7), wherein the adsorption molecule includes an alkyl group having carbon number of 4 or larger.

(11) The dispersion material according to any one of (1) to (10), wherein the adsorption molecule is one of a pyrene-based compound, a perylene-based compound, a perinone-based compound, a quinacridone-based compound, a quinacridonequinone-based compound, an antraquinone-based compound, a phthalocyanine-based compound, a naphthalocyanine-based compound, an anthanthrone-based compound, a benzimidazolone-based compound, a condensed-disazo-based compound, a disazo-based compound, an azo-based compound, an indanthrone-based compound, a triarylcarbonium-based compound, a dioxazine-based compound, an aminoanthraquinone-based compound, a diketopyrrolo-pyrrole-based compound, indigos, thioindigos, an isoindoline-based compound, an isoindolinone-based compound, a porphyrin-based compound, a pyranthrone-based compound, an isoviolanthrone-based compound, a xanthene-based compound, a triarylmethane-based compound, an azulene-based compound, a squarylium-based compound, a cyanine-based compound, an acene-based compound, a thiophene-based compound, a triphenylmethane-based compound, a ruthenium-complex-based compound, a nickel-complex-based compound, C.I. Acid Blue 83, C.I. Acid Blue 90, C.I. Solvent Blue 38, C.I. Acid Violet 17, C.I. Acid Violet 49, C.I. Acid Green 3, a methine dye, and a monomethine dye.

(12) The dispersion material according to any one of (1) to (11), wherein the plurality of semiconductor nanoparticles have a light absorption end of about 500 nanometers or less, and the adsorption molecule has a light absorption peak within a range from about 300 nanometers to about 400 nanometers both inclusive.

(13) The dispersion material according to any one of (1) to (11), wherein the plurality of semiconductor nanoparticles have a light absorption end within a range from about 400 nanometers to about 600 nanometers both inclusive, and the adsorption molecule has a light absorption peak within a range from about 400 nanometers to about 500 nanometers both inclusive.

(14) The dispersion material according to any one of (1) to (11), wherein the plurality of semiconductor nanoparticles have a light absorption end within a range from about 500 nanometers to about 700 nanometers both inclusive, and the adsorption molecule has a light absorption peak within a range from about 500 nanometers to about 600 nanometers both inclusive.

(15) The dispersion material according to any one of (1) to (11), wherein the plurality of semiconductor nanoparticles have a light absorption end within a range from about 600 nanometers to about 800 nanometers both inclusive, and the adsorption molecule has a light absorption peak within a range from about 600 nanometers to about 700 nanometers both inclusive.

(16) The dispersion material according to any one of (1) to (11), wherein the plurality of semiconductor nanoparticles have a light absorption end within a range from about 700 nanometers to about 2000 nanometers both inclusive, and the adsorption molecule has a light absorption peak within a range from about 700 nanometers to about 2000 nanometers both inclusive.

(17) A photoelectric conversion device including
a photoelectric conversion section including a nanoparticle layer,
the nanoparticle layer including
a plurality of semiconductor nanoparticles, and
an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

(18) The photoelectric conversion device according to (17), wherein a distance between adjacent semiconductor nanoparticles in the plurality of semiconductor nanoparticles is about 10 nanometers or less.

(19) An imaging unit including
a photoelectric conversion device including a nanoparticle layer,
the nanoparticle layer including
a plurality of semiconductor nanoparticles, and
an adsorption molecule configured to selectively absorb light having a predetermined wavelength, the adsorption molecule being adsorbed to each of the plurality of semiconductor nanoparticles, and the adsorption molecule having a plane aligned to be non-parallel to a direction from a center portion of each of the plurality of semiconductor nanoparticles toward an adsorption portion of each of the plurality of semiconductor nanoparticles.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A dispersion material comprising:
a semiconductor nanoparticle comprising one of NiO, $InSnO_x$, $MnO_2$, CrO, $CuInSe_2$, $CuInS_2$, $AgInS_2$, Si, PbS, PbSe, PbTe, CdS, CdSe, CdTe, GaAs, GaP, InP, InAs, Ge, $In_2S_3$, $Bi_2S_3$, ZnSe, ZnTe, and ZnS; and
an adsorption molecule configured to selectively absorb light having a predetermined wavelength, the adsorption molecule being adsorbed to the semiconductor nanoparticle, and the adsorption molecule having a plane aligned in a direction along a tangential line of the semiconductor nanoparticle.

2. The dispersion material according to claim 1, wherein the adsorption molecule has a planar molecule structure.

3. The dispersion material according to claim 1, wherein LUMO energy level of the adsorption molecule is within a range of 0.2 energy volts or less from energy level of conduction band of the plurality of semiconductor nanoparticles.

4. The dispersion material according to claim 1, wherein HOMO energy level of the adsorption molecule is within a range of 0.2 energy volts or less from energy level of valence band of the plurality of semiconductor nanoparticles.

5. The dispersion material according to claim 1, wherein the semiconductor nanoparticle has a radius of about 1 nanometer or larger.

6. The dispersion material according to claim 1, wherein the adsorption molecule is one of an organic molecule and a metal complex molecule that are used as one of a pigment and a dye.

7. The dispersion material according to claim 1, wherein the adsorption molecule includes a polymerizable functional group.

8. The dispersion material according to claim 1, wherein the adsorption molecule includes one of an unsaturated ethylene group and a cyclic ether group.

9. The dispersion material according to claim 1, wherein the adsorption molecule includes an alkyl group having carbon number of 4 or larger.

10. The dispersion material according to claim 1, wherein the adsorption molecule is one of a pyrene-based compound, a perylene-based compound, a perinone-based compound, a quinacridone-based compound, a quinacridonequinone-based compound, an antraquinone-based compound, a phthalocyanine-based compound, a naphthalocyanine-based compound, an anthanthrone-based compound, a benzimidazolone-based compound, a condensed-disazo-based compound, a disazo-based compound, an azo-based compound, an indanthrone-based compound, a triarylcarbonium-based compound, a dioxazine-based compound, an aminoanthraquinone-based compound, a diketo-pyrrolo-pyrrole-based compound, indigos, thioindigos, an isoindoline-based compound, an isoindolinone-based compound, a porphyrin-based compound, a pyranthrone-based compound, an isoviolanthrone-based compound, a xanthene-based compound, a triarylmethane-based compound, an azulene-based compound, a squarylium-based compound, a cyanine-based compound, an acene-based compound, a thiophene-based compound, a triphenylmethane-based compound, a ruthenium-complex-based compound, a nickel-complex-based compound, C.I. Acid Blue 83, C.I. Acid Blue 90, C.I. Solvent Blue 38, C.I. Acid Violet 17, C.I. Acid Violet 49, C.I. Acid Green 3, a methine dye, and a monomethine dye.

11. The dispersion material according to claim 1, wherein the adsorption molecule has a light absorption peak within a range from about 300 nanometers to about 400 nanometers both inclusive.

12. The dispersion material according to claim 1, wherein the adsorption molecule has a light absorption peak within a range from about 400 nanometers to about 500 nanometers both inclusive.

13. The dispersion material according to claim 1, wherein the adsorption molecule has a light absorption peak within a range from about 500 nanometers to about 600 nanometers both inclusive.

14. The dispersion material according to claim 1, wherein the adsorption molecule has a light absorption peak within a range from about 600 nanometers to about 700 nanometers both inclusive.

15. The dispersion material according to claim 1, wherein the adsorption molecule has a light absorption peak within a range from about 700 nanometers to about 2000 nanometers both inclusive.

* * * * *